(12) United States Patent
Chou et al.

(10) Patent No.: US 10,853,447 B2
(45) Date of Patent: Dec. 1, 2020

(54) BEZIER VOLUME REPRESENTATION OF POINT CLOUD ATTRIBUTES

(71) Applicant: 8i Limited, Wellington (NZ)

(72) Inventors: Philip A. Chou, Culver City, CA (US); Maxim Koroteev, Karori (NZ); Maja Krivokuca, Rennes (FR); Robert James William Higgs, Porirua (NZ); Charles Loop, Culver City, CA (US)

(73) Assignee: 8i Limited, Wellington (NZ)

( * ) Notice: Subject to any disclaimer, the term of this patent is extended or adjusted under 35 U.S.C. 154(b) by 148 days.

(21) Appl. No.: 16/250,704

(22) Filed: Jan. 17, 2019

(65) Prior Publication Data

US 2019/0228050 A1  Jul. 25, 2019

Related U.S. Application Data

(60) Provisional application No. 62/619,516, filed on Jan. 19, 2018.

(51) Int. Cl.
| | |
|---|---|
| *G06F 17/15* | (2006.01) |
| *G06F 17/16* | (2006.01) |
| *H03M 7/30* | (2006.01) |
| *G06F 17/17* | (2006.01) |
| *G06T 15/00* | (2011.01) |

(52) U.S. Cl.
CPC ............ *G06F 17/156* (2013.01); *G06F 17/16* (2013.01); *G06F 17/175* (2013.01); *G06T 15/00* (2013.01); *H03M 7/30* (2013.01); *H03M 7/3059* (2013.01); *H03M 7/3066* (2013.01); *H03M 7/3077* (2013.01); *H03M 7/3082* (2013.01)

(58) Field of Classification Search
CPC ......... G06F 17/15; G06F 17/07; G06T 15/00; G06T 17/30; G06T 9/00; H03M 7/30; H04N 19/00
USPC ........................................................ 708/200
See application file for complete search history.

(56) References Cited

U.S. PATENT DOCUMENTS

| | | | | |
|---|---|---|---|---|
| 10,061,300 | B1 * | 8/2018 | Coffman | ................ G06N 7/005 |
| 2007/0229493 | A1 * | 10/2007 | Tubaro | ................... G06T 17/20 |
| | | | | 345/419 |

(Continued)

OTHER PUBLICATIONS

"Draco 3D data compression", [Online]. Retrieved from the internet: <URL:https://github.com/google/draco>, (accessed Jan. 10, 2018), 10 pgs.

(Continued)

*Primary Examiner* — Tan V Mai
(74) *Attorney, Agent, or Firm* — Schwegman Lundberg & Woessner, P.A.

(57) ABSTRACT

The systems and methods discussed herein implement a volumetric approach to point cloud representation, compression, decompression, communication, or any suitable combination thereof. The volumetric approach can be used for both geometry and attribute compression and decompression, and both geometry and attributes can be represented by volumetric functions. To create a compressed representation of the geometry or attributes of a point cloud, a suitable set of volumetric functions are transformed, quantized, and entropy-coded. When decoded, the volumetric functions are sufficient to reconstruct the corresponding geometry or attributes of the point cloud.

20 Claims, 8 Drawing Sheets

(56) References Cited

U.S. PATENT DOCUMENTS

2015/0294502 A1* 10/2015 Bonner ................. G06F 30/00
345/420
2018/0332480 A1* 11/2018 Pang ..................... H04W 16/18

OTHER PUBLICATIONS

"Draft Call for Proposals for Point Cloud Compression", International Organization for standardization MPEG 3DG, (Oct. 2016), 12 pgs.

Chou, P A, et al., "Dynamic polkygon clouds: Represenation and compression for vr/ar", Cornell University Library arXiv.org > cs > arXiv:1610.00402v2, (Mar. 8, 2017), 28 pgs.

Curless, Brian, et al., "A Volumetric Method for Building Complex Models from Range Images", Proceedings of the 23rd annual conference on Computer graphics and interactive tehniques, (1996), 303-312.

De Queiroz, R L, et al., "Compression of 3D Point Clouds Using a Region-Adaptive Hierarchical Transform", IEEE Transactions on Image Processing, vol. 25, No. 8, Aug. 2016, (Aug. 2016), 3947-3956.

Huang, Y, et al., "A generic scheme for progressive point cloud coding", IEEE Trans. Vis. Comput. Graphics, vol. 14, No. 2, (Mar. 2008), 440-453.

Kammerl, J, et al., "Real-time compression of point cloud streams", 2012 IEEE International Conference on Robotics and Automation, (May 2012), 778-785.

Loop, C, et al., "A closed-form Bayesian fusion equation using occupancy probablilities", Proc. Fourth Int'l Conf. on 3D Vision (3DV'16). IEEE, Oct. 2016., (Oct. 2016), 380-388.

Luenberger, D G, "Optimation by Vector Space Methods", John Wiley & Sons, Inc. 1969, (1969), 51-52.

Queiroz, R L, et al., "Transform Coding for Point Clouds Using a Gaussian Process Model", IEEE Transactions on Image Processing, vol. 26, No. 7, Jul. 2017, (Jul. 2017), 3507-3517.

Schnabel, Ruwen, et al., "Octree-based Point-Cloud Compression", Eurographics Symposium on Point-Based Graphics, (Jul. 2006), 111-121.

Weir, A J, "Lebesgue Integration and Measure", Cambridge University Press, 1973, (1973), 165.

Zhang, C, et al., "Point cloud attribute compression with graph transform", IEE International Conference Image Processing, (Oct. 2014), 2066-2070.

* cited by examiner

BEZIER VOLUME REPRESENTATION OF POINT CLOUD ATTRIBUTES

RELATED APPLICATION

This application claims the priority benefit of U.S. Provisional Patent Application No. 62/619,516, filed Jan. 19, 2018, which is incorporated herein by reference in its entirety.

TECHNICAL FIELD

The subject matter disclosed herein generally relates to the technical field of special-purpose machines that facilitate computer graphics, including software-configured computerized variants of such special-purpose machines and improvements to such variants, and to the technologies by which such special-purpose machines become improved compared to other special-purpose machines that facilitate computer graphics. Specifically, the present disclosure addresses systems and methods to facilitate, among other things, representation of point cloud attributes with a data structure based on a Bezier volume.

BACKGROUND

A machine (e.g., a computer graphics processing machine) may be configured to generate, store, access, send, receive, compress, decompress, modify, render, display, or any suitable combination thereof, a data structure that represents computer graphics or some portion thereof. In computer graphics, a point cloud is a set of points (also known as locations or positions) in Euclidean space, with a vector of one or more attributes associated with each point (e.g., a color vector, such as a color triple, or a motion vector). Point clouds may be static or dynamic. A dynamic point cloud can be considered to be a sequence of static point clouds, each in its own frame. Point clouds have applications in robotics, tele-operations, virtual and augmented reality, cultural heritage preservation, geographic information systems, and so forth.

Point clouds can represent volumetric media, which may be popularly known as holograms. In general, a hologram is an object or scene whose representation permits rendering arbitrary points of view, such that the object or scene appears to occupy space due to stereo or motion parallax. A point cloud can form all or part of a data structure that represents a hologram, because each point, with one or more corresponding color attributes, can represent the color of light rays that pass through that point.

Volumetric media have emerged as the first significant new modality for immersive communication since the introduction of audio for audio recordings and the introduction of video for motion pictures. Like audio and video, volumetric media may be used in three major communication scenarios: on-demand consumption of pre-recorded content, broadcast of live or pre-recorded content, and interactive communication, such as telephony or conferencing. Since point clouds can be very large, especially for complex objects or scenes, efficient storage and transmission may be important; hence data compression may be important.

Two issues in point cloud compression are geometry compression and attribute compression. Geometry compression, which may be called shape compression, involves compressing the point locations; attribute compression involves compressing the attribute values, given the point locations. Some approaches to point cloud compression compress both geometry and attributes. For example, the attributes of each point may be compressed and decompressed under the assumption that the point locations have already been compressed and decompressed, and that the decompressed point locations are available to the encoder and decoder as supplemental information when the attribute compression is done. Some other approaches to point cloud compression compress the color attributes of each point by truncating the color components (e.g., RGB values) to a few bits each. More sophisticated compression can result in an order of magnitude reduction in bit rate. Other approaches use Graph Transforms, a Regional Adaptive Haar Transform (RAHT), or a Karhunen Loeve transform based on a Gaussian Process model. In such approaches, the attributes are viewed as a signal $f_1, \ldots, f_N$ defined on a finite set of N points $x_1, \ldots, x_N$ in space, and the transforms are viewed as discrete transforms on these N points, where N is the number of points in the point cloud.

BRIEF DESCRIPTION OF THE DRAWINGS

Some embodiments are illustrated by way of example and not limitation in the figures of the accompanying drawings.

DETAILED DESCRIPTION

Figure 1:
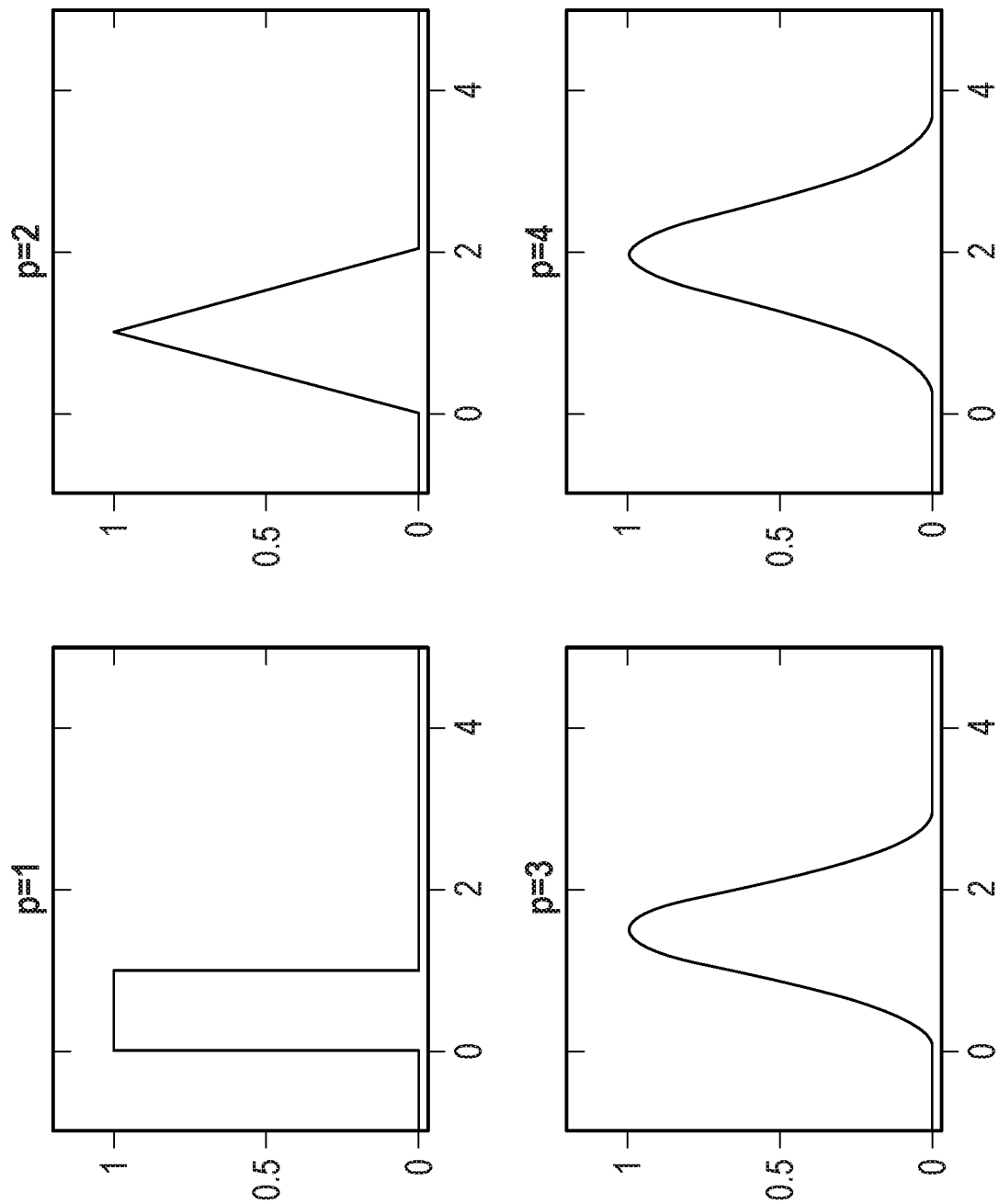
FIG. 1 is a diagram illustrating central B-spline basis functions of order p, according to some example embodiments.

Example methods (e.g., algorithms) facilitate representation of attributes of a point cloud, which may accordingly facilitate generation, compression, decompression, or other processing of a data structure that represents the attributes of the point cloud. Example systems (e.g., special-purpose machines configured by special-purpose software) are configured to perform such example methods. Examples merely typify possible variations. Unless explicitly stated otherwise, structures (e.g., structural components, such as modules) are optional and may be combined or subdivided, and operations (e.g., in a procedure, algorithm, or other function) may vary in sequence or be combined or subdivided. In the following description, for purposes of explanation, numerous specific details are set forth to provide a thorough understanding of various example embodiments. It will be evident to one skilled in the art, however, that the present subject matter may be practiced without these specific details.

The systems and methods described herein represent the attributes of a point cloud volumetrically within a data structure, and such a data structure may be generated or stored in a computer-readable medium, such as a memory or storage drive, as well as communicated (e.g., transmitted or received) or otherwise processed (e.g., modified, compressed, decompressed, rendered, or displayed). A volumetric representation of the attributes is a function $f(x)$ defined over all points x in space, not just the finite set of points $x_1, \ldots, x_N$ in the point cloud. Once the set of points $x_1, \ldots, x_N$ is transmitted, and the volumetric function $f$ is transmitted, the value of the attributes on each point can be reconstructed as $\hat{f}(x_1), \ldots, \hat{f}(x_N)$, where $\hat{f}$ is the recovered version of $f$. The systems and methods described herein represent the volumetric function $f$ as a sequence of wavelet coefficients or other coefficients (e.g., within a data structure that specifies such a sequence). The coefficients are compressed using quantization, entropy coding, or both, and are accordingly decompressed using entropy decoding, inverse quantization, or both, to reconstruct an approximation of the function. Representing the volumetric function $f$ in a B-spline basis of order p=1 provides results similar to representing the values $f_1, \ldots, f_N$ using RAHT. Furthermore, the systems and methods described herein may represent the volumetric function $f$ in a B-spline basis of order p=2. This basis causes the reconstructed function $\hat{f}$ to be continuous, which may be helpful for certain applications.

The systems and methods discussed herein implement a volumetric approach to point cloud representation, compression, decompression, communication, or any suitable combination thereof. The volumetric approach can be used for both geometry and attribute compression and decompression, and both geometry and attributes can be represented by volumetric functions. As used herein, the term "volumetric function" refers to a scalar-valued or vector-valued function defined on a volume of space (e.g., in contrast to a function defined on an image plane or on a finite set of points). To create a compressed representation of the geometry or attributes of a point cloud, a suitable set of volumetric functions are transformed, quantized, and entropy-coded. When decoded, the volumetric functions are sufficient to reconstruct the corresponding geometry or attributes of the point cloud.

A scalar volumetric function is used to represent the geometry of a point cloud, and the geometry of the point cloud can be reconstructed by obtaining the level set of the decoded scalar volumetric function. Certain example embodiments use a signed distance function or an occupancy probability as the scalar volumetric function for geometry.

A vector-valued volumetric function is used to represent attributes of the point cloud, and the systems and methods described herein generally use a vector-valued volumetric function having the same dimension as the attributes. The attributes can accordingly be reconstructed by obtaining the values of the decoded vector-valued volumetric function at the points of the decoded geometry. Certain example embodiments determine the vector-valued volumetric function by solving a linear regression. The parameters of the function may be B-spline wavelet coefficients, similar to the parameters of linked Bezier volumes. Such functions exist in a Hilbert space in which distance and orthogonality are induced by an inner product defined by a novel counting measure supported by the decoded point locations.

Measure

Let $\Omega$ be a set, and let $\sigma(\Omega)$ be sigma algebra of subsets of $\Omega$. A measure is a function $\mu: \sigma \to R$ that assigns a real number to each set in $\sigma(\Omega)$.

It is helpful to focus on the case where $\Omega = R^3$. Suppose a finite set of points in $R^3$, say $B = \{x_1, \ldots, x_N\}$. For each set $M \in \sigma(R^3)$, define $\nu(M) = |M \cap B|$ to be the number of such points in M. This can be called a counting measure.

Let $f: R^3 \to R$ be a real-valued function on $R^3$. The integral of $f$ over a set $M \in \sigma(R^3)$ with respect to measure $\mu$ is denoted $\int_M f(x) d\mu(x)$. When $\mu$ is a counting measure, the integral is equal to $$\int_M f(x) d\mu(x) = \sum_{x_n \in M} f(x_n). \quad (1)$$

Hilbert Space

A Hilbert space is a complete normed vector space equipped with an inner product that induces the norm. Consider the Hilbert space F of real-valued functions $f: R^3 \to R$ equipped with inner product $$<f, g> = \int f(x) g(x) d\mu(x) = \sum_n f(x_n) g(x_n), \quad (2)$$

where $f, g \in F$, and $\|f\| \triangleq \sqrt{<f,f>}$ is the induced norm.

Note that $\|f\|$ depends on the value of $f$ only at the points $x_1, \ldots, x_N$. Hence, strictly speaking, $\|f\|$ is only a pseudo-norm, as there are non-zero functions $f: R^3 \to R$ such that $\|f\| = 0$. However, $\|f\|$ can be called a norm with the usual understanding that $\|f\| = 0$ implies $f = 0$ almost everywhere (a.e.) with respect to measure $\mu$. Alternatively, one can consider the space of equivalence classes of functions, where two functions $f$ and g are deemed equivalent if $f = g$ a.e. Denoting by $\tilde{f}$ the equivalence class of functions equivalent to $f$, one can show that the set of equivalence classes $\tilde{F} = \{\tilde{f} | f: R^3 \to R\}$ is a vector space with a proper norm $\|\tilde{f}\|$ induced by the inner product $<\tilde{f}, \tilde{g}>$, which in turn is induced by the inner product $<f, g>$ between representatives. The vector space $\tilde{F}$ is isomorphic to $R^N$, and is hence a Hilbert space. Thus, take F to be a Hilbert space with the usual "almost everywhere" understanding or with the equivalence class understanding.

With the inner product and norm so determined, other properties of the Hilbert space follow. Specifically, a vector $g \in F$ is orthogonal to a vector $f \in F$ iff $<f, g> = 0$. A vector $g \in F$ is orthogonal to a subspace $F_0 \subseteq F$ iff g is orthogonal to all $f \in F_0$. A subspace $G_0 \subseteq F$ is the orthogonal complement to a subspace $F_0 \subseteq F$ iff, for all $g \in G_0$, g is orthogonal to $F_0$. A point $f_0^* \in F_0$ is the projection of a point $f \in F$ onto the subspace $F_0 \in F$ iff it minimizes $\|f - f_0\|$ over $f_0 \in F_0$. The projection $f_0^*$ of $f$ onto $F_0$, denoted $f \circ F_0$, exists and is unique almost everywhere with respect to the measure $\mu$. A necessary and sufficient condition for $f_0^*$ to be the projection of $f$ onto $F_0$ is that the approximation error $(f - f_0^*)$ is orthogonal to $F_0$.

Bezier Volumes

A Bézier curve of degree m is a function on the unit interval $b: [0,1] \to R$ specified as a linear combination of Bernstein polynomials, namely, $$b(x) = \sum_{i=0}^{m} B_i b_{m,i}(x), \quad (3)$$

where $B_0, \ldots, B_m$ are the coefficients of the linear combination, and $$b_{m,i}(x) = \binom{m}{i} x^i (1-x)^{m-i}, \quad (4)$$

$i=0, \ldots, m$, are the m th order Bernstein polynomials, which are polynomials of degree m defined on the unit interval [0,1].

Analogously, a Bézier volume (BV) of degree m is a function on the unit cube $b:[0,1]^3 \to R$ specified as a linear combination of products of Bernstein polynomials, namely, $$b(x, y, z) = \sum_{i=0}^{m} \sum_{j=0}^{m} \sum_{k=0}^{m} B_{ijk} b_{m,i}(x) b_{m,j}(y) b_{m,k}(z), \quad (5)$$

where $B_{ijk}$, i, j, k$\in\{0, \ldots, m\}$, are the coefficients of the linear combination.

A function b(x, y, z) is tri polynomial of degree m if it is a polynomial of degree m in each of its coordinates when its other coordinates have any fixed value. Thus, a BV is tri-polynomial of degree m over the unit cube.

Cardinal B-Splines

A cardinal B-spline function of order p is a function on the real line $f: R \to R$ specified as a linear combination of B-spline basis functions of order p, namely $$f(x) = \sum_{n \in Z} F_n \phi^{(p)}(x-n), \quad (6)$$

where $F_n$, $n \in Z$, are the coefficients of the linear combination, and $\phi^{(p)}(x-n)$ is the B-spline basis function of order p at integer shift n. The B-spline basis function $\phi^{(p)}(x)$ can be defined for p=1 as $$\phi^{(1)}(x) = \begin{cases} 1 & x \in [0, 1] \\ 0 & \text{otherwise} \end{cases} \quad (7)$$

and recursively for p>1 as $$\phi^{(p)}(x) = \int \phi^{(1)}(t) \phi^{(p-1)}(x-t) dt \quad (8)$$

for all x. From this definition, it can be seen that $\phi^{(p)}(x)$ is the p-fold convolution of $b^{(0)}(x)$ with itself, and that the support of $\phi^{(p)}(x)$ is an interval of length p, as shown in FIG. 1.

An alternative recursive definition for p>1 is $$\phi^{(p)}(x) = \frac{1}{p-1} [x \phi^{(p)}(x) + (p-x) \phi^{(p)}(x-1)] \quad (9)$$

for $x \in [0, p]$ and $\phi^{(p)}(x)=0$ otherwise. From this second definition, it follows that $\phi^{(p)}(x)$ is a polynomial of degree p−1 on all integer shifts of the unit interval, [n, n+1], n$\in$Z, which may be called blocks, and that $f(x)$ is piecewise polynomial of degree p−1 over each block. It also follows that $f(x)$ is $C^{p-2}$ continuous, meaning that $f(x)$ and all of its derivatives up to its (p−2)th derivative are continuous, even at the breakpoints between blocks, which may be called knots.

Analogously, a cardinal B-spline volume of order p is a volumetric function $f: R^3 \to R$ specified as a linear combination of vector integer shifts of a product of B-spline basis functions of order p, namely $$f(x) = \sum_{n \in Z^3} F_n \phi^{(p)}(x-n), \quad (10)$$

where $F_n$ is the coefficient of the linear combination at vector integer shift n$\in Z^3$, $\phi^{(p)}(x)=\phi^{(p)}(x, y, z)=\phi^{(p)}(x)\phi^{(p)}(y)\phi^{(p)}(z)$ is the product of B-spline basis functions $\phi^{(p)}(x)$, $\phi^{(p)}(y)$, and $\phi^{(p)}(z)$.

It can be seen that $f(x)$ is tri-polynomial of degree p−1 over each shifted unit cube $[0,1]^3$+n, or block. Further, it can be seen that $f(x)$ is $C^{p-2}$ continuous between blocks. Thus, $f(x)$ can be considered to be a collection of Bezier volumes of degree p−1 linked together such that the overall function is $C^{p-2}$ continuous.

Approximation

Let $\phi_{0,0}(x)=\phi^{(p)}(x-n_1)$ be the central cardinal B-spline basis function, that is, the cardinal B-spline basis function centered on the origin 0 (if p is even) or on the unit cube $[0,1]^3$ (if p is odd). Let $\phi_{0,n}(x)=\phi_{0,0}(x-n)$ be this central cardinal B-spline basis function shifted by integer vector n.

For notational simplicity, one can suppress the dependence of $\phi_{0,n}$ on p. Specific values of p are discussed below.

Let F be the Hilbert space of all functions $f: R^3 \to R$ under the inner product equation (2), as defined above. Define the subspace $F_0 \subseteq F$ as $$F_0 = \left\{ f_0 \in F \mid \exists \{F_n\} \text{ s.t. } f_0(x) = \sum_{n \in Z^3} F_n \phi_{0,n}(x) \right\}. \quad (11)$$

This is the subspace of all functions that are tri-polynomial of degree p−1 over the blocks $\{[0,1]^3 + n | n \in Z^3\}$.

Any function $f \in F$ can be approximated by a function $f_0^* \in F_0$, where $f_0^*$ is the projection of $f$ onto $F_0$, denoted $f_0^* = f \circ F_0$. Let $\{F_n^*\}$ be coefficients such that $f_0^*(x) = {}_n(x)$. Under the inner product equation (2), the squared error between $f$ and $f_0^*$.

$$\|f - f_0^*\|^2 = \sum_{i=1}^{N} (f(x_i) - f_0^*(x_i))^2, \quad (12)$$

depends on the values of $f_0^*$ only at the points $x_1, \ldots, x_N$, which in turn depend on any particular coefficient $F_n^*$ only if $\phi_{0,n}(x_i) \neq 0$ for some $x_i$, $i=1 \ldots, N$. Let $$N_0 = \{n | \exists i \in \{1, \ldots, N\} \text{ s.t. } \phi_{0,n}(x_i) \neq 0\} \quad (13)$$

be the set of vector integer shifts n such that $\phi_{0,n}(x_i) \neq 0$ for some $x_i$. This set is finite because $\phi_{0,0}$ has bounded support, and any of its shifts far away from the points $x_1, \ldots x_N$ will not include any such point in its support. Let $\{n_i\}$ denote the finite set of shifts in $N_0$.

For any $n \in N_0$, assign $F_n^*=0$, and for any $n \in N_0$, solve for $F_n^*$ by noting that the approximation error $(f - f_0^*)$ must be orthogonal to $\phi_{0,n}$ for all $n \in Z^3$. In particular, for all $n_i \in N_0$, $$0 = \langle \phi_{0,n_i}, f - f_0^* \rangle = \langle \phi_{0,n_i}, f \rangle - \langle \phi_{0,n_i}, f_0^* \rangle, \text{ or} \qquad (14)$$

$$\langle \phi_{0,n_i}, f \rangle = \langle \phi_{0,n_i}, f_0^* \rangle = \sum_{n_j \in N_0} \langle \phi_{0,n_i}, \phi_{0,n_j} \rangle F_{n_j}^*. \qquad (15)$$

In vector form, $$\Phi_0^T f = \Phi_0^T \Phi_0 F^* \qquad (16)$$

where $\Phi_0^T f$ is shorthand for the $|N_0| \times 1$ vector $[\langle \phi_{0,n_i}, f \rangle]$, $\Phi_0^T \Phi_0$ is shorthand for the $|N_0| \times N_0$ matrix $[\langle \phi_{0,n_i}, \phi_{0,n_j} \rangle]$, and $F^*$ is the $|N_0| \times 1$ vector $[F_{n_j}^*]$. If $\Phi_0^T \Phi_0$ is invertible, then one may solve for $F^*$ explicitly as $$F^* = (\Phi_0^T \Phi_0)^{-1} \Phi_0^T f \qquad (17)$$

Multiresolution Approximation

To obtain approximations at different resolutions, the cardinal B-spline basis functions can be scaled by a factor of $2^{-\ell}$, where $\ell$ is the scale or level of detail or simply level. To be specific, define $$\phi_{\ell,n}(x) = \phi_{0,n}(2^\ell x) \qquad (18)$$

as the cardinal B-spline basis function at level $\ell$ and shift n. Define the subspace $F_\ell \subseteq F$ as $$F_\ell = \left\{ f_\ell \in F \mid \exists \{F_{\ell,n}\} \text{ s.t. } f_\ell(x) = \sum_{n \in Z^3} F_{\ell,n} \phi_{\ell,n}(x) \right\}. \qquad (19)$$

This is the subspace of all functions that are tri-polynomial of degree p−1 over the blocks at level $\ell$, $\{2^{-\ell}([0,1]^3+n) | n \in Z^3\}$. Since the blocks at level $\ell$ are refined by the blocks at level $\ell+1$, it is clear that if a function $f_\ell$ is tri-polynomial over the blocks at level $\ell$, i.e., $f_\ell \in F_\ell$, then it is also tri-polynomial over the blocks at level $\ell+1$, i.e., $f_\ell \in F_{\ell+1}$. Hence $F_\ell \subseteq F_{\ell+1}$ and $$F_0 \subseteq F_1 \subseteq \ldots \subseteq F_\ell \subseteq F_{\ell+1} \subseteq \ldots \subseteq F \qquad (20)$$

is a nested sequence of subspaces whose resolution increases with $\ell$.

Let $f_\ell^* = f \circ F_\ell$ and $f_{\ell+1}^* = f \circ F_{\ell+1}$ be the projections of $f$ onto $F_\ell$ and $F_{\ell+1}$, respectively. Then, by the Pythagorean theorem, for all $f_\ell \in F_\ell \subseteq F_{\ell+1}$, $$\|f - f_\ell\|^2 = \|f - f_{\ell+1}^*\|^2 + \|f_{\ell+1}^* - f_\ell\|^2. \qquad (21)$$

Then since $f_\ell^* = f \circ F_\ell$ minimizes $\|f - f_\ell\|^2$ over all $f_\ell \in F_\ell$, by equation (21) $f_\ell^*$ must also minimize $\|f_{\ell+1}^* - f_\ell\|^2$ over all $f_\ell \in F_\ell$, and hence $f_\ell^* = f_{\ell+1}^* \circ F_\ell$. That is, projecting $f$ onto $F_\ell$ can be done in two steps, by first projecting onto $F_{\ell+1}$ (i.e., $f_{\ell+1}^* = f \circ F_{\ell+1}$) and then onto $F_\ell$ (i.e., $f_\ell^* = f_{\ell+1}^* \circ F_\ell$). Alternatively, $f \circ F_\ell = f \circ F_{\ell+1} \circ F_\ell$.

Paralleling the development described above, let $$N_\ell = \{n \mid \exists i \in \{1, \ldots, N\} \text{ s.t. } \phi_{\ell,n}(x_i) \neq 0\} \qquad (22)$$

be the finite set of vector integer shifts n such that $\phi_{\ell,n}(x_1) \neq 0$ for some $x_i$. Then, for all $n_i \in N_\ell$, $$0 = \langle \phi_{\ell,n_i}, f - f_\ell^* \rangle = \langle \phi_{\ell,n_i}, f \rangle - \langle \phi_{\ell,n_i}, f_\ell^* \rangle, \text{ or} \qquad (23)$$

-continued $$\langle \phi_{\ell,n_i}, f \rangle = \langle \phi_{\ell,n_i}, f_\ell^* \rangle = \sum_{n_j \in N_\ell} \langle \phi_{\ell,n_i}, \phi_{\ell,n_j} \rangle F_{\ell,n_j}^*, \qquad (24)$$

where $f_\ell^* = \sum_{n_j \in N_\ell} F_{\ell,n_j}^* \phi_{\ell,n_j}^{(p)}$. In vector form, equation (24) can be expressed $$\Phi_\ell^T f = \Phi_\ell^T \Phi_\ell F_\ell^* \qquad (25)$$

where $\Phi_\ell^T f$ is shorthand for the $|N_\ell| \times 1$ vector $[\langle \phi_{\ell,n_i}, f \rangle]$, $\Phi_\ell^T \Phi_\ell$ is shorthand for the $|N_\ell| \times |z,114|$ matrix $[\langle \phi_{\ell,n_i}, \phi_{\ell,n_j} \rangle]$, and $F_\ell^*$ is the $|N_\ell| \times 1$ vector $[F_{\ell,n_j}^*]$. If $\Phi_\ell^T \Phi_\ell$ is invertible, then one may solve for $F_\ell^*$ explicitly as $$F_\ell^* = (\Phi_\ell^T \Phi_\ell)^{-1} \Phi_\ell^T f. \qquad (26)$$

In turn, one may compute $\Phi_\ell^T f$ and $\Phi_\ell^T \Phi_\ell$ recursively from $\Phi_{\ell-1}^T$ and $\Phi_\ell^T \Phi_{\ell+1}$, respectively, as follows.

Since $\phi_{\ell,n}^{(p)} \in F_\ell \subseteq F_{\ell+1}$, there exist coefficients $\{a_k\}$ not depending on $\ell$ such that $$\phi_{\ell,n} = \sum_{k \in Z^3} a_k \phi_{\ell+1,n+k} = \sum_{k' \in Z^3} a_{k'-n} \phi_{\ell+1,k'} \qquad (27)$$

Equation (27) is known as the two-scale equation. From this equation, it follows that $$\langle \phi_{\ell,n_i}, f \rangle = \sum_{n_j \in N_{\ell+1}} a_{n_j-n_i} \langle \phi_{\ell+1,n_j}, f \rangle \qquad (28)$$

and $$\langle \phi_{\ell,n_i}, \phi_{\ell,n_j} \rangle = \sum_{n_k \in N_{\ell+1}} \sum_{n_l \in N_{\ell+1}} a_{n_k-n_i} \langle \phi_{\ell+1,n_k}, \phi_{\ell,n_l} \rangle a_{n_{l+1}-n_j}. \qquad (29)$$

In vector form, $$\Phi_\ell^T f = A_{\ell+1} \Phi_{\ell+1}^T f \qquad (30)$$

and $$\Phi_\ell^T \Phi_\ell = A_{\ell-1} \Phi_{\ell+1}^T \Phi_{\ell+1} A_{\ell-1}^T \qquad (31)$$

where $A_{\ell-1} = [a_{n_j-n_i}]$.

Wavelets

Let $G_\ell$ be the orthogonal complement of $F_\ell$ in $F_{\ell+1}$, i.e., $$F_{\ell+1} = F_\ell \otimes G_\ell. \qquad (32)$$

Applying this recursively, $$F = F_0 \otimes G_0 \otimes G_1 \otimes \ldots \otimes G_\ell \otimes \ldots, \qquad (33)$$

so that any function $f_{\ell+1} \in F_{\ell+1}$ can be written as the sum of orthogonal functions, $$f_{\ell-1} = f_0 + g_0 + g_1 + \ldots + g_\ell + \ldots. \qquad (34)$$

The coefficients of $f_0$ in the basis for $F_0$ are low pass coefficients, while the coefficients of $g_\ell$ in the basis for $G_\ell$ are high pass or wavelet coefficients. The function $f$ can be efficiently communicated by performing quantizing, entropy coding, or both, on its low pass and wavelet coefficients. This is efficient, because most of the energy in $f$ is in its low pass coefficients and its low-level wavelet coefficients.

To compute the low pass coefficients, equation (17) can be used, while to compute the wavelet coefficients, it helps to first establish a basis for each $G_\ell$.

First, some definitions: For each $\ell$, let $\Phi_\ell = [\phi_{\ell,n_j}]$ be a row vector containing the functions $\phi_{\ell,n_j}$, $n_j \in N_\ell$, and let $F_\ell$ be a column vector of $|N_\ell|$ coefficients. Let $\Phi_\ell F_\ell$ denote a function $f_\ell = \sum_{n_j \in N_\ell} F_{\ell,n_j} \phi_{\ell,n_j}$ in $F_{\ell+1}$. Let $\Phi_\ell^T f = [<\phi_{\ell,n_i}, f>]$ denote the column vector of inner products of the functions $\phi_{\ell,n_i}$, $n_i \in N_\ell$, with the function $f$. Similarly, let $\Phi_\ell^T [f_1, \ldots, f_n] = [<\phi_{\ell,n_i}, f_j>]$ denote the matrix of inner products of the functions $\phi_{\ell,n_i}$, $n_i \in N_\ell$, with the functions $f_j$, $j=1, \ldots, n$.

Consider now the subspace $G_\ell \subseteq F_{\ell+1}$ defined by $$G_\ell = \{\Phi_{\ell+1} F_{\ell+1} : \Phi_\ell^T \Phi_{\ell+1} F_{\ell+1} = 0\} \quad (35)$$

It can be seen that $G_\ell$ is a subspace of $F_{\ell+1}$ and is orthogonal to $F_\ell = \{\Phi_\ell F_\ell\}$, and hence $G_\ell$ is the orthogonal complement of $F_\ell$ in $F_{\ell+1}$. If $N_{\ell+1}$ is the dimension of $F_{\ell+1}$, and $N_\ell$ is the dimension of $F_\ell$, then $N_{\ell+1} - N_\ell$ is the dimension of $G_\ell$. For the moment, assume $N_\ell = |N_\ell|$. When $\ell$ is large, the dimension $N_\ell$ of $F_\ell$ may be lower than $|N_\ell|$, due to the finite number of points $x_1, \ldots, x_N$.

One way to construct an explicit basis for $G_\ell$ is as follows. Partition the $N_\ell \times N_{\ell+1}$ matrix $\Phi_\ell^T \Phi_{\ell+1}$ into an $N_\ell \times N_\ell$ matrix R' and an $N_\ell \times (N_{\ell+1} - N_\ell)$ matrix R", as $\Phi_\ell^T \Phi_{\ell+1} = [R' \ R'']$. Similarly partition the $N_{\ell+1}$ dimensional vector $F_{\ell+1}$ into an $N_\ell$ dimensional vector F' and an $N_{\ell+1} - N_\ell$ dimensional vector F", as $$F_{\ell+1} = \begin{bmatrix} F' \\ F'' \end{bmatrix}. \quad (36)$$

Then, for all $F_{\ell+1}$ satisfying $\Phi_\ell^T \Phi_{\ell+1} F_{\ell+1} = 0$ in equation (35), $$[R' \ R''] \begin{bmatrix} F' \\ F'' \end{bmatrix} = 0 \quad (37)$$

$$(R')^{-1} [R' \ R''] \begin{bmatrix} F' \\ F'' \end{bmatrix} = 0 \quad (38)$$

$$[I' \ (R')^{-1} R''] \begin{bmatrix} F' \\ F'' \end{bmatrix} = 0 \quad (39)$$

where I' is the $N_\ell \times N_\ell$ identity matrix. Hence, $F' = -(R')^{-1} R'' F''$, and $$G_\ell = \left\{ \Phi_{\ell+1} \begin{bmatrix} -(R')^{-1} R'' \\ I'' \end{bmatrix} F'' \middle| F'' \in R^{N_{\ell+1} - N_\ell} \right\} \quad (40)$$

where I" is the $(N_{\ell+1} - N_\ell) \times (N_{\ell+1} - N_\ell)$ identity matrix. Thus, the $(N_{\ell+1} - N_\ell)$ functions in the row vector $$\Psi_\ell = \Phi_{\ell+1} \begin{bmatrix} -(R')^{-1} R'' \\ I'' \end{bmatrix} \quad (41)$$

form an explicit basis for $G_\ell$.

Now that a basis is established for $G_\ell$, any function $f_{\ell+1} = \Phi_{\ell+1} F_{\ell+1} \in F_{\ell+1}$ can be decomposed as the sum of functions $f_\ell = \Phi_\ell F_\ell \in F_\ell$ and $g_\ell = \Psi_\ell G_\ell \in G_\ell$, specifically, $$\Phi_{\ell+1} F_{\ell+1} = [\Phi_\ell \ \Psi_\ell] \begin{bmatrix} F_\ell \\ G_\ell \end{bmatrix}. \quad (42)$$

From equation (42), one can obtain two formulas for an analysis filter bank, which formulas produce coefficients $F_\ell$ and $G_\ell$ from coefficients $F_{\ell+1}$, and two formulas for a synthesis filter bank, which formulas produce coefficients $F_{\ell+1}$ from coefficients $F_\ell$ and $G_\ell$.

For the first two formulas, take the inner product of equation (42) with the $N_{\ell+1}$ functions in $\Phi_{\ell+1}$, $$\Phi_{\ell+1}^T \Phi_{\ell+1} F_{\ell+1} = \Phi_{\ell+1}^T [\Phi_\ell \ \Psi_\ell] \begin{bmatrix} F_\ell \\ G_\ell \end{bmatrix}, \quad (43)$$

yielding $$F_{\ell+1} = [\Phi_{\ell+1}^T \Phi_{\ell+1}]^{-1} \Phi_{\ell+1}^T [\Phi_\ell \ \Psi_\ell] \begin{bmatrix} F_\ell \\ G_\ell \end{bmatrix} \quad (44)$$

for the synthesis and $$[\Phi_{\ell+1}^T [\Phi_\ell \ \Psi_\ell]]^{-1} \Phi_{\ell+1}^T \Phi_{\ell+1} F_{\ell+1} = \begin{bmatrix} F_\ell \\ G_\ell \end{bmatrix} \quad (45)$$

for the analysis.

Figure 2:
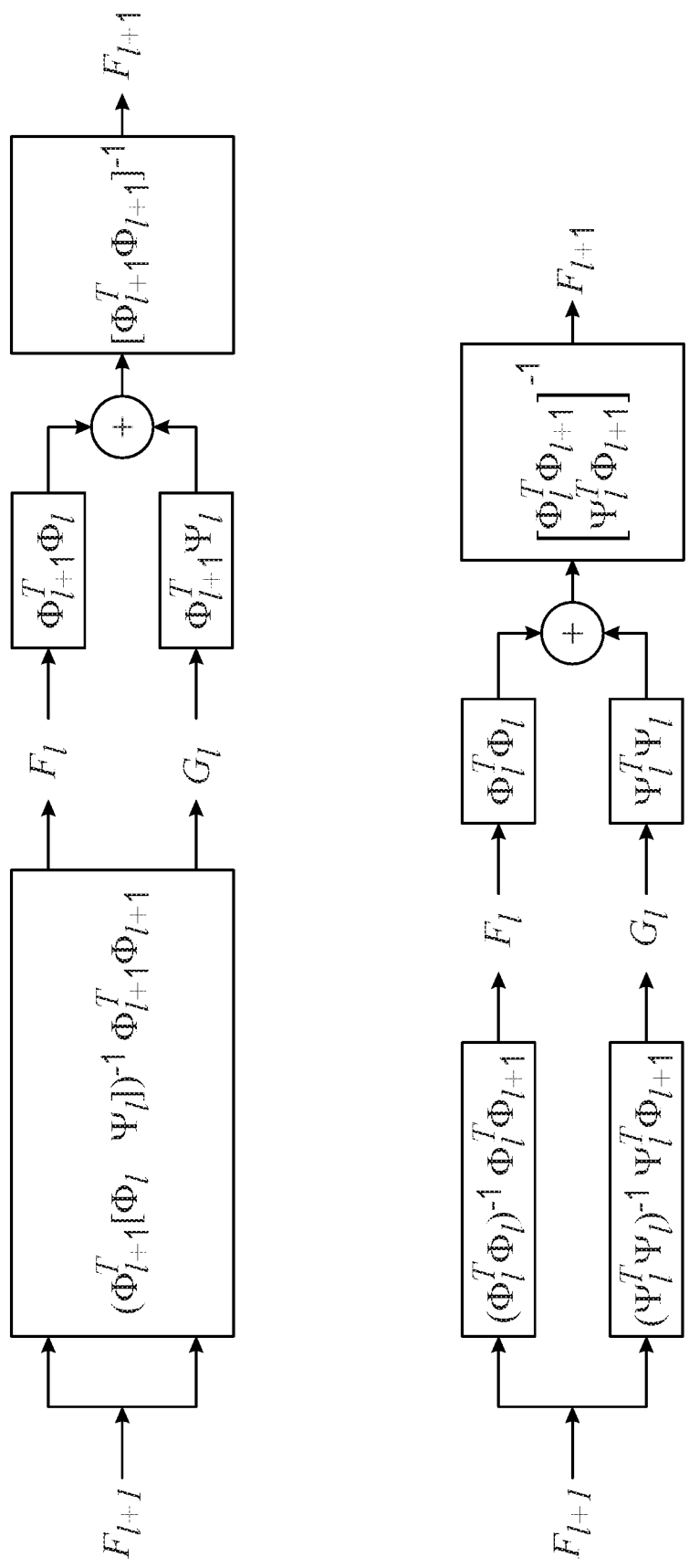
FIG. 2 is a block diagram illustrating two different analysis-synthesis structures, according to some example embodiments.

For the second two formulas, take the inner product of equation (42) with the $N_\ell$ functions in $\Phi_\ell$ and the $N_{\ell+1} - N_\ell$ functions in $\Psi_\ell$, $$[\Phi_\ell \ \Psi_\ell]^T \Phi_{\ell+1} F_{\ell+1} = \begin{bmatrix} \Phi_\ell^T \Phi_\ell & 0 \\ 0 & \Psi_\ell^T \Psi_\ell \end{bmatrix} \begin{bmatrix} F_\ell \\ G_\ell \end{bmatrix}, \quad (46)$$

yielding $$F_{\ell+1} = [[\Phi_\ell \ \Psi_\ell]^T \Phi_{\ell+1}]^{-1} \begin{bmatrix} \Phi_\ell^T \Phi_\ell & 0 \\ 0 & \Psi_\ell^T \Psi_\ell \end{bmatrix} \begin{bmatrix} F_\ell \\ G_\ell \end{bmatrix} \quad (47)$$

for the synthesis and $$\begin{bmatrix} \Phi_\ell^T \Phi_\ell & 0 \\ 0 & \Psi_\ell^T \Psi_\ell \end{bmatrix}^{-1} [\Phi_\ell \ \Psi_\ell]^T \Phi_{\ell+1} F_{\ell+1} = \begin{bmatrix} F_\ell \\ G_\ell \end{bmatrix} \quad (48)$$

for the analysis. These two structures are shown in FIG. 2. The analysis portion of one structure can be matched with the synthesis portion of the other structure, and vice versa. These structures may be nested, recursively decomposing the low pass coefficients.

Attribute Coding using Region Adaptive Hierarchical Transforms

The systems and methods described herein represent and may compress or decompress the real-valued attributes of a point cloud using volumetric functions. It is assumed that an encoder is given a set of point locations $x_1, \ldots, x_N$ and a set of corresponding attributes $f_1, \ldots, f_N$. It is also assumed that the point locations can be communicated to the decoder without loss. A technical problem of attribute compression is to reproduce approximate attributes, $\hat{f}_1, \ldots, \hat{f}_N$, at the decoder, subject to a constraint on the number of bits communicated, given the point locations as supplemental information (e.g., side information). For clarity and brevity, the discussion herein focuses on attributes that are scalar. Vector attributes can be accordingly treated component-wise.

At an example embodiment of the encoder, a volumetric B-spline of order p is fit to the values $f_1, \ldots, f_N$ at locations $x_1, \ldots, x_N$, and its wavelet coefficients are quantized and entropy coded. At an example embodiment of the decoder, the wavelet coefficients are entropy decoded and dequantized, and the volumetric B-spline is reconstructed. Finally, the reconstructed volumetric B-spline is sampled at the locations $x_1, \ldots, x_N$, and the corresponding values $\hat{f}_1, \ldots, \hat{f}_N$ are used as reproductions of the attributes.

The next three sections focus on volumetric B-splines of orders 1, 2, and higher orders.

Constant B-Splines

Volumetric B-splines of order p=1, or constant B-splines, are presently discussed. It can be shown that constant B-splines are equivalent to the RAHT.

Figure 3:
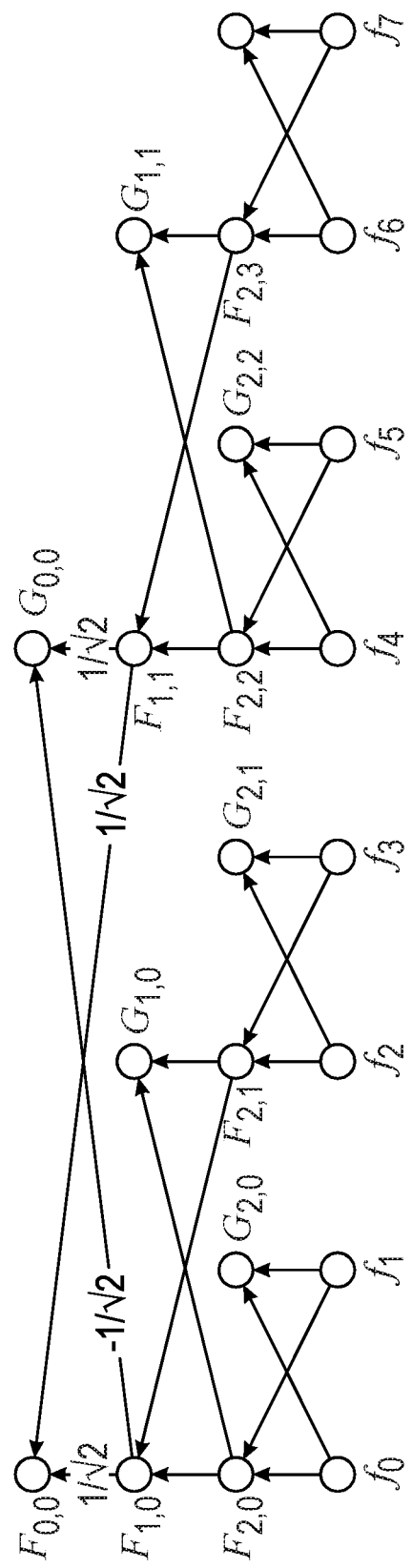
FIG. 3 is a diagram illustrating a Haar Transform butterfly structure for depth d=3, according to some example embodiments.
Figure 4:
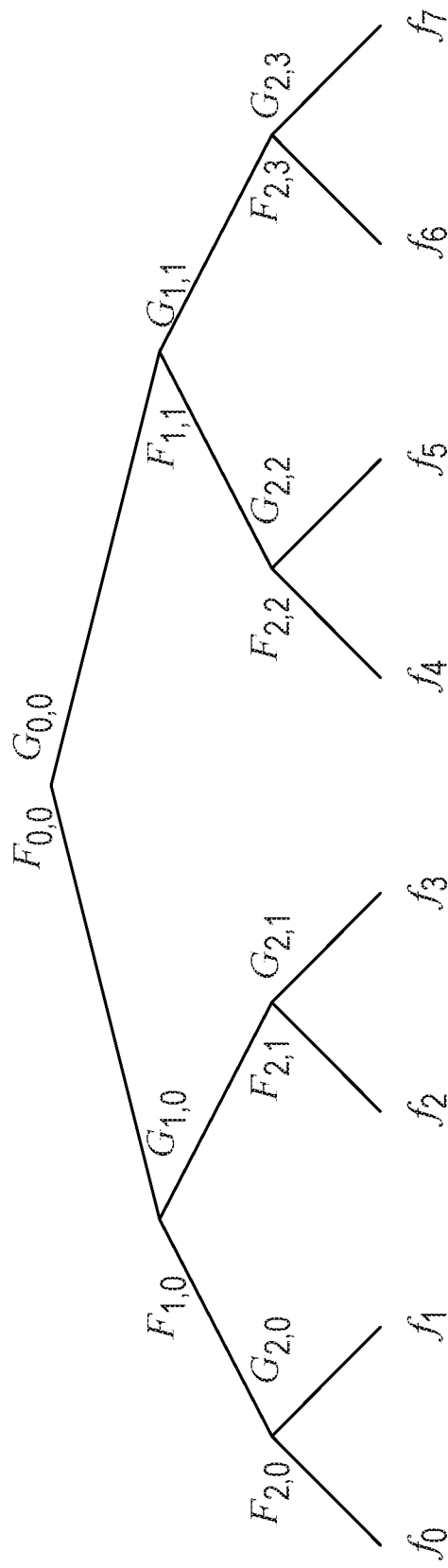
FIG. 4 is a diagram illustrating a RAHT tree structure for depth d=3, according to some example embodiments.

RAHT is a generalization of the Haar Transform. The Haar Transform of a sequence of $2^d$ coefficients $f_0, \ldots, f_{2^d-1}$ can be described as a series of orthonormal butterfly transforms, $$\begin{bmatrix} \overline{F}_{\ell,n} \\ \overline{G}_{\ell,n} \end{bmatrix} = \begin{bmatrix} \frac{1}{\sqrt{2}} & \frac{1}{\sqrt{2}} \\ -\frac{1}{\sqrt{2}} & \frac{1}{\sqrt{2}} \end{bmatrix} \begin{bmatrix} \overline{F}_{\ell+1,2n} \\ \overline{F}_{\ell+1,2n+1} \end{bmatrix}, \quad (49)$$

for $\ell = d-1, \ldots, 0$ and $n = 0, \ldots, 2^\ell - 1$, beginning with $F_{d,n} = f_n$, $n = 0, \ldots, 2^d - 1$, The butterfly structure for d=3 is shown in FIG. 3. This can equally well be regarded as a full binary tree, as shown in FIG. 4, in which the signal samples $f_0, \ldots, f_{2^d-1}$ are located at the leaves of the tree, the high pass coefficients $\overline{G}_{\ell,n}$ are located at the intermediate nodes of the tree, and the DC coefficient is located at the root of the tree.

Figure 5:
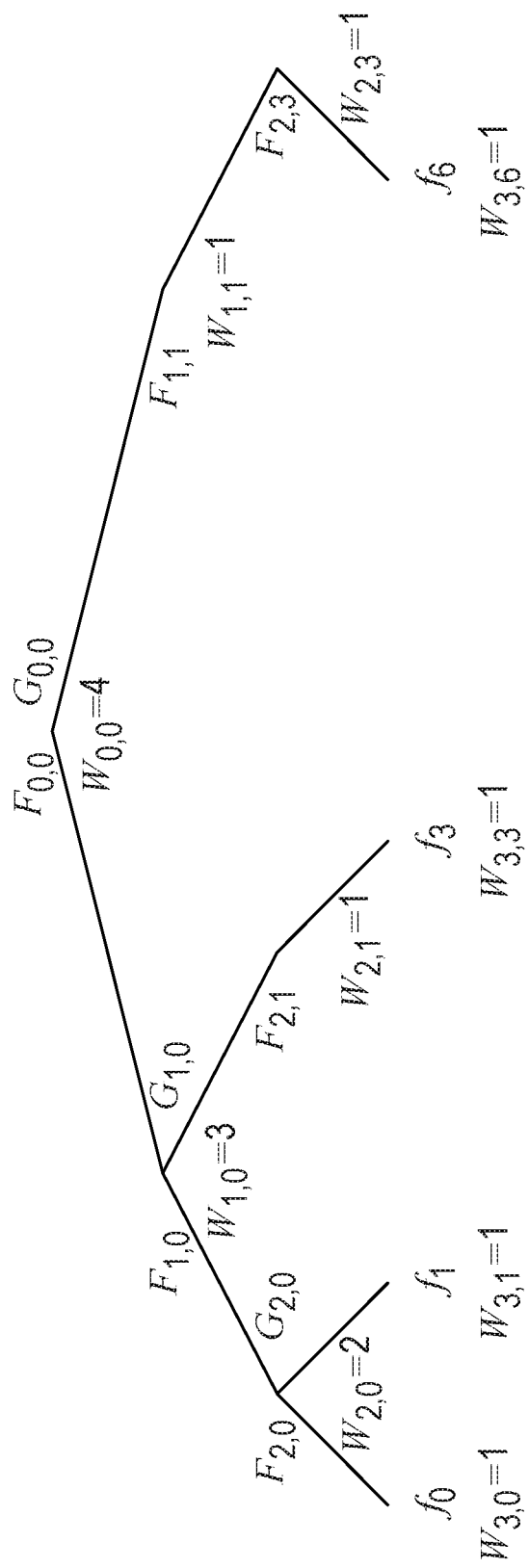
FIG. 5 is a diagram illustrating a Haar Transform tree structure for depth d=3, according to some example embodiments.

The RAHT is a generalization of the Haar Transform in that the tree is not necessarily full, in that the internal nodes of the tree may be either binary or unary, and the butterfly transform at each internal binary node of the tree is a Givens rotation, $$\begin{bmatrix} \overline{F}_{\ell,n} \\ \overline{G}_{\ell,n} \end{bmatrix} = \begin{bmatrix} a & b \\ -b & a \end{bmatrix} \begin{bmatrix} \overline{F}_{\ell+1,2n} \\ \overline{F}_{\ell+1,2n+1} \end{bmatrix}, \quad (50)$$

where $$a = \frac{\sqrt{w_{l+1,2n}}}{\sqrt{w_{l+1,2n} + w_{l+1,2n+1}}}, \quad (51)$$

$$b = \frac{\sqrt{w_{l+1,2n+1}}}{\sqrt{w_{l+1,2n} + w_{l+1,2n+1}}}, \quad (52)$$

$$w_{l,n} = w_{l+1,2n} + w_{l+1,2n+1} \quad (53)$$

for $\ell = 0, \ldots, d-1$, and $w_{d,n}$ equals 1 for all n in the signal and equals 0 otherwise. $W_{\ell,n}$ is called the weight of node n at level $\ell$ and is equal to the total of the weights of all the leaves descended from node n in level $\ell$. The tree for RAHT is shown in FIG. 5.

To apply RAHT to a signal $f_1, \ldots, f_N \in \mathbb{R}$ defined on point locations $x_1, \ldots, x_N \in \mathbb{R}^3$, first scale the point locations so that the set $X = \{x_1, \ldots, x_N\}$ fits within the unit cube, $X \subset [0,1)^3$, and choose d sufficiently large so that each point location $x = (x, y, z) \in X$ can be represented uniquely with d bits of precision, as $x = \sum_{b=1}^{d} x_b 2^{-b}$, $y = \sum_{b=1}^{d} y_b 2^{-b}$, $z = \sum_{b=1}^{d} z_b 2^{-b}$, or in more conventional notation, $$x = .x_1 \ldots x_d, \quad (54)$$

$$y = .y_1 \ldots y_d, \quad (55)$$

$$z = .z_1 \ldots z_d, \quad (56)$$

The Morton code of point location $x = (x, y, z)$ is defined as the interleaving of its coefficients' bits, $$\text{Morton}(x) = .z_1 y_1 x_1 \ldots z_d y_d x_d. \quad (57)$$

Now the RAHT tree of depth 3d can be constructed with N leaves, with $f_i$ at leaf i, such that the path from the root of the tree to leaf i is given by the Morton code of $x_i$. Thus, each node in the tree, if it is at level $\ell$, is associated with the common length $-\ell$ prefix shared by the Morton codes of the node's descendants. Two nodes at level $\ell + 1$ are siblings if their length $-(\ell + 1)$ Morton prefixes are adjacent in Morton order, also known as Z-scan order. The Givens rotation is applied to such siblings.

As described above, RAHT is a transform on a signal defined on a discrete set of points, but it also has an interpretation as a transform of a signal defined on a volume. To see that, note that the nodes at level $\ell$ of the RAHT tree partition not only the points $x_1, \ldots, x_N$, but also the volume $[0,1)^3$. For example, consider a node at a level $\ell = 3\ell'$ whose Morton prefix is $.z_1 y_1 x_1 \ldots z_{\ell'} y_{\ell'} x_{\ell'}$. This node corresponds to the set of all points $x \in [0,1)^3$ that have this same Morton prefix, namely the cube $$B_{\ell,(n_x,n_y,n_z)} = [2^{-\ell'} n_x, 2^{-\ell'}(n_x+1)) \times [2^{-\ell'} n_y, 2^{-\ell'}(n_y+1)) \times [2^{-\ell'} n_z, 2^{-\ell'}(n_z+1)), \quad (58)$$

where $n_x = \sum_{b=1}^{\ell'} x_b 2^{\ell'-b}$, $n_y = \sum_{b=1}^{\ell'} y_b 2^{\ell'-b}$, and $n_z = \sum_{b=1}^{\ell'} z_b 2^{\ell'-b}$. This is a $2^{\ell'} \times 2^{\ell'} \times 2^{\ell'}$ cube at vector integer shift $n = (n_x, n_y, n_z)$, where $n_x, n_y, n_z \in \{0, \ldots, 2^{\ell'} -1\}$. For nodes at levels $\ell$ that are not a multiple of three, the notation may seem a little clumsy, but similar and straightforward. Specifically, a node at level $\ell = 3\ell'+1$ corresponds to a $2^{-\ell'} \times 2^{-\ell'} \times 2^{-(\ell'+1)}$ cuboid $B_{\ell,n}$ at vector integer shift $n = (n_x, n_y, n_z)$, where $n_x, n_y \in \{0, \ldots, 2^{\ell'}-1\}$ and $n_z \in \{0, \ldots, 2^{\ell'+1}-1\}$, and a node at level $\ell = 3\ell'+2$ corresponds to a $2^{-\ell'} \times 2^{-(\ell'+1)} \times 2^{-(\ell'+1)}$ cuboid $B_{\ell,n}$ at vector integer shift $n = (n_x, n_y, n_z)$, where $n_x \in \{0, \ldots, 2^{\ell'}-1\}$ and $n_y, n_z \in \{0, \ldots, 2^{\ell'+1}-1\}$. At any level, these cuboids are called blocks. A block $B_{\ell,n}$ is said to be occupied if it contains a point, that is, if $B_{\ell,n} \cap X \neq \emptyset$. Each node in the RAHT tree at level $\ell$ corresponds to an occupied block at level $\ell$.

Let $\phi_{\ell,n}(x)$ the indicator function for block $B_{\ell,n}$, namely $$\phi_{l,n}(x) = \begin{cases} 1 & x \in B_{l,n} \\ 0 & \text{otherwise} \end{cases}, \quad (59)$$

and, as in equation (22), let $N_\ell$ be the set of vector integer shifts n such that $\phi_{\ell,n}(x_i) \neq 0$ for some $i = 1, \ldots, N$, that is, let $N_\ell$ be the set of vector integer shifts n such that $B_{\ell,n}$ is occupied. Then, as in equation (19), let $F_\ell$ be the subspace of functions that are linear combinations of $\phi_{\ell,n}$ for $n \in N_\ell$, $$F_l = \left\{ f_l \in F \mid \exists \{F_{l,n}\} \text{ s.t. } f_l = \sum_{n \in N_l} F_{l,n} \phi_{l,n} \right\}. \tag{60}$$

Let $f: [0,1)^3 \rightarrow R$ be any function that agrees with $f_i$ on $x_i$, i.e., $f(x_i)=f_i$, $i=1, \ldots, N$, and let $f_\ell^* = \sum_{n \in N_\ell} F_{\ell,n}^* \phi_{\ell,n}$ be the projection of $f$ onto $F_\ell$. Again, let $\Phi_\ell^T f$ denote the $|N_\ell| \times 1$ vector $[<\phi_{\ell,n_i}, f>]$, let $\Phi_\ell^T \Phi_\ell$ denote the $|N_\ell| \times |N_\ell|$ matrix $[<\phi_{\ell,n_i}, \phi_{\ell,n_j}>]$, and let $F_\ell^*$ denote the $|N_\ell| \times 1$ vector $[F_{\ell,n_i}^*]$. If $\Phi_\ell^T \Phi_\ell$ is invertible, then $$F_\ell^* = (\Phi_\ell^T \Phi_\ell)^{-1} \Phi_\ell^T f. \tag{61}$$

From the definition of $\phi_{\ell,n}$ in equation (59) and the inner product equation (2), it can be seen that $<\phi_{\ell,n}, f> = \sum_{x_i \in B_{\ell,n}} f(x_i)$ and $<\phi_{\ell,n}, \phi_{\ell,n'}>$ equals $w_{\ell,n}$ if $n=n'$ and equals 0 otherwise, where $w_{\ell,n} = \mu(B_{\ell,n})$ is the number of points in the set $B_{\ell,n}$. Hence $F_{\ell,n}^*$ is the average value of the attributes of the points in $B_{\ell,n}$ namely $$F_{l,n}^* = \frac{\langle \phi_{l,n}, f \rangle}{w_{l,n}} = \frac{1}{w_{l,n}} \sum_{x_i \in B_{l,n}} f(x_i), \tag{62}$$

for $n \in N_\ell$.

To express the two-scale equation for $\phi_{\ell,n}$ succinctly regardless of whether t is a multiple of three or not, the following notation is used. If $\ell$, n are the level and shift of a block, then "$\ell+1,2n$" and "$\ell+1,2n+1$" mean the level and shifts of its two subblocks. To be pedantic, "$\ell+1,2n$" and "$\ell+1,2n+1$" mean $\ell+1, (n_x, n_y, 2n_z)$ and $\ell+1, (n_x, n_y, 2n_z+1)$ if $\ell = 3\ell'$ (i.e., $\ell$ is a multiple of 3); they mean $\ell+1, (n_x, 2n_y, n_z)$ and $\ell+1, (n_x, 2n_y+1, n_z)$ if $\ell = 3\ell'+1$ (i.e., $\ell \equiv 1 \mod 3$); and they mean $\ell+1, (2n_x, n_y, n_z)$ and $\ell+1, (2n_x+1, n_y, n_z)$ if $\ell = 3\ell'+2$ (i.e., $\ell \equiv 2 \mod 3$).

Now the two-scale equation for $\phi_{\ell,n}$ can be readily expressed $$\phi_{\ell,n} = \phi_{\ell+1,2n} + \phi_{\ell+1,2n+1}, \tag{63}$$

so that combining equations (62) and (63), $$F_{l,n}^* = \frac{\langle \phi_{l+1,2n}, f \rangle}{w_{l,n}} + \frac{\langle \phi_{l+1,2n+1}, f \rangle}{w_{l,n}} \tag{64}$$

$$= \frac{w_{l+1,2n}}{w_{l,n}} F_{l+1,2n}^* + \frac{w_{l+1,2n+1}}{w_{l,n}} F_{l+1,2n+1}^* \tag{65}$$

$$= \frac{w_0}{w_0 + w_1} F_{l+1,2n}^* + \frac{w_1}{w_0 + w_1} F_{l+1,2n+1}^*, \tag{66}$$

where, to be more concise, one can abbreviate $w_0 = w_{\ell+1,2n}$ and $w_1 = w_{\ell+1,2n+1}$. Both $w_0$ and $w_1$ will be non-zero when $\ell$, n correspond to a node in the tree with two children. For such $\ell$, n, define the function $$\psi_{l,n} = -\frac{\phi_{l+1,2n}}{w_0} + \frac{\phi_{l+1,2n+1}}{w_1}, \tag{67}$$

and define $$G_{l,n}^* = \frac{w_0 w_1}{w_0 + w_1} \langle \psi_{l,n}, f \rangle. \tag{68}$$

Then combining equations (68), (67), and (62), $$G_{l,n}^* = \frac{w_0 w_1}{w_0 + w_1} \left( -\frac{\langle \phi_{l+1,2n}, f \rangle}{w_0} + \frac{\langle \phi_{l+1,2n+1}, f \rangle}{w_1} \right) \tag{69}$$

$$= \frac{w_0 w_1}{w_0 + w_1} (-F_{l+1,2n}^* + F_{l+1,2n+1}^*), \tag{70}$$

which is the scaled difference between the average values of the attributes of the points in the two sub-blocks $B_{\ell+1,2n}$ and $B_{\ell+1,2n+1}$ of $B_{\ell,n}$. When $f$ is smooth, $G_{\ell,n}^*$ will be close to zero. Putting equations (66) and (70) in matrix form, $$\begin{bmatrix} F_{l,n}^* \\ G_{l,n}^* \end{bmatrix} = \begin{bmatrix} \frac{w_0}{w_0 + w_1} & \frac{w_1}{w_0 + w_1} \\ -\frac{w_0 w_1}{w_0 + w_1} & \frac{w_0 w_1}{w_0 + w_1} \end{bmatrix} \begin{bmatrix} F_{l+1,2n}^* \\ F_{l+1,2n+1}^* \end{bmatrix}. \tag{71}$$

Both $\phi_{\ell,n}$ and $\psi_{\ell,n}$ have support only on $B_{\ell,n}$, and hence they are both orthogonal to both $\phi_{\ell,n'}$ and $\psi_{\ell,n'}$ for vector integer shifts $n' \neq n$. Yet it can also be seen that $\phi_{\ell,n}$ and $\psi_{\ell,n}$ are orthogonal to each other, since $<\phi_{\ell,n}, \psi_{\ell,n}> = -1 + 1 = 0$. Thus, the orthogonal complement of $F_\ell$ in $F_{\ell+1}$ is $$G_l = \left\{ g_l \mid g_l = \sum_{n \in N_l^b} G_{l,n} \psi_{l,n} \right\}, \tag{72}$$

where the sum is over only those vector integer shifts $N_\ell^b \subseteq N_\ell$, for which $\ell$, n correspond to a node in the tree with two children. However, as defined, the orthogonal basis functions $\phi_{\ell,n}$ and $\psi_{\ell,n}$ are not normalized. Define their normalized versions as $$\bar{\phi}_{l,n} = \frac{\phi_{l,n}}{\|\phi_{l,n}\|} = \frac{\phi_{l,n}}{\sqrt{w_0 + w_1}}, \tag{73}$$

$$\bar{\psi}_{l,n} = \frac{\psi_{l,n}}{\|\psi_{l,n}\|} = \frac{\psi_{l,n}}{\sqrt{\frac{1}{w_0} + \frac{1}{w_1}}} = \frac{\sqrt{w_0 w_1}}{w_0 + w_1} \psi_{l,n}. \tag{74}$$

Then $f_l = \sum_{n \in N_l} F_{l,n} \phi_{l,n} = \sum_{n \in N_l} \bar{F}_{l,n} \bar{\phi}_{l,n}$ and $$g_l = \sum_{n \in N_l^b} G_{l,n} \psi_{l,n} = \sum_{n \in N_l^b} \bar{G}_{l,n} \bar{\psi}_{l,n},$$

where $$\bar{F}_{l,n} = \sqrt{w_0 + w_1} \, F_{l,n}, \tag{75}$$

$$\bar{G}_{l,n} = \frac{\sqrt{w_0 + w_1}}{\sqrt{w_0 w_1}} G_{l,n}. \tag{76}$$

Rewriting equation (71), $$\begin{bmatrix} \frac{1}{\sqrt{w_0 + w_1}} \bar{F}_{l,n}^* \\ \frac{\sqrt{w_0 w_1}}{\sqrt{w_0 + w_1}} \bar{G}_{l,n}^* \end{bmatrix} = \begin{bmatrix} \frac{w_0}{w_0 + w_1} & \frac{w_1}{w_0 + w_1} \\ -\frac{w_0 w_1}{w_0 + w_1} & \frac{w_0 w_1}{w_0 + w_1} \end{bmatrix} \begin{bmatrix} \frac{\bar{F}_{l+1,2n}^*}{\sqrt{w_0}} \\ \frac{\bar{F}_{l+1,2n+1}^*}{\sqrt{w_1}} \end{bmatrix}, \tag{77}$$

or

-continued $$\begin{bmatrix} F^*_{l,n} \\ G^*_{l,n} \end{bmatrix} = \begin{bmatrix} \frac{\sqrt{w_0}}{\sqrt{w_0 + w_1}} & \frac{\sqrt{w_1}}{\sqrt{w_0 + w_1}} \\ -\frac{\sqrt{w_1}}{\sqrt{w_0 + w_1}} & \frac{\sqrt{w_0}}{\sqrt{w_0 + w_1}} \end{bmatrix} \begin{bmatrix} F^*_{l+1,2n} \\ F^*_{l+1,2n+1} \end{bmatrix}. \quad (78)$$

This is identical to equation (50) with $$a = \frac{\sqrt{w_0}}{\sqrt{w_0 + w_1}} = \frac{\sqrt{w_{l+1,2n}}}{\sqrt{w_{l+1,2n} + w_{l+1,2n+1}}}, \quad (79)$$

$$b = \frac{\sqrt{w_1}}{\sqrt{w_0 + w_1}} = \frac{\sqrt{w_{l+1,2n+1}}}{\sqrt{w_{l+1,2n} + w_{l+1,2n+1}}}. \quad (80)$$

The asterisks are reminders that if RANT is applied to the values $f_1, \ldots, f_N$ of a volumetric function $f(x)$ at point locations $x_1, \ldots, x_N \in R^3$, the resulting coefficients $F^*_{l,n}$, $n \in N_l$, are optimal in that they represent the projection $f^* = \sum_{n \in N_l} F^*_{l,n} \phi_{l,n}$ of $f$ onto the subspace $F_l$.

Thus, RAHT has a volumetric interpretation.

Tri-Linear B-Splines

Volumetric B-splines of order p=2, or tri-linear B-splines, are presently discussed. These splines are continuous, unlike constant B-splines. Tri-linear B-splines reduce blocking artifacts, and perhaps helpfully, do not develop rips, tears, or holes when the surface or motion representation is quantized, due to their guaranteed continuity.

Begin with the central cardinal B-spline of order p=2, $$\phi^{(2)}(x-1) = \begin{cases} 1+x & x \in [-1, 0] \\ 1-x & x \in [0, 1] \\ 0 & \text{otherwise} \end{cases}, \quad (81)$$

and define the volumetric version $$\phi_{0,0}(x) = \phi^{(2)}(x-1)\phi^{(2)}(y-1)\phi^{(2)}(z-1). \quad (82)$$

Then $\phi_{l,n}(x) = \phi_{0,0}(2^l x - n)$ is the tri-linear B-spline basis function at level $l$ with vector integer shift n. As in equation (19), let $$F_l = \left\{ f_l \in F \mid \exists \{F_{l,n}\} \text{ s.t. } f_l(x) = \sum_{n \in C_l} F_{l,n} \phi_{l,n}(x) \right\}. \quad (83)$$

be the subspace of all functions in the Hilbert space F that are tri-linear over all blocks $B_{l,n}$, $n \in Z^3$, at level $l$. It suffices to take the sum over vector integer shifts $n \in C_l$, where $C_l$ is the collection of corners of the occupied blocks $B_{l,n}$, $n' \in \Psi_{l,n}$. This is because $\phi_{l,n}(x_i)=0$ for all vector integer shifts $n \in C_l$.

As in equation (26), the projection of $f \in F$ onto $F_l$ is given by $F^*_l = (\Phi^T_l \Phi_l)^{-1} \Phi^T_l f$, where $\Phi^T_l f$ is the $|C_l| \times 1$ vector $[<\phi_{l,n_i}, f>]$, $\Phi^T_l \Phi_l$ is the $|C_l| \times |C_l|$ matrix $[<\phi_{l,n_i}, \phi_{l,n_j}>]$, and $F^*_l$ is the $|C_l| \times 1$ vector $[F^*_{l,n}]$. However, the matrix $\Phi^T_l \Phi_l$ in the case of tri-linear splines, unlike the case of constant splines, is block tri-diagonal, rather than diagonal, and hence is more difficult to invert. Nevertheless, $\Phi^T_l \Phi_l$ is sparse, and thus inversion by iterative methods is feasible.

The elements of $\Phi^T_l \Phi_l$ and $\Phi^T_l f$ do not have to be computed directly from their definitions. Rather, they can be computed directly from their definitions in the case of $l = d+1$, and then they can be computed recursively for $l \leq d$, using the two-scale equation (27). For the tri-linear B-spline, the coefficients in the two-scale equation are $$a_k = \begin{cases} 2^{-\|k\|_1} & k \in \{-1, 0, 1\}^3 \\ 0 & \text{otherwise} \end{cases}, \quad (84)$$

where $\|k\|_1 = |k_x| + |k_y| + |k_z|$ is the 1-norm of $k = (k_x, k_y, k_z)$. Thus, as in equations (30) and (31), for $l \leq d$, $$\Phi^T_l f = A_{l+1} \Phi^T_{l+1} f \quad (85)$$

and $$\Phi^T_l \Phi_l = A_{l+1} \Phi^T_{l+1} \Phi_{l+1} A^T_{l+1} \quad (86)$$

where $A_{l+1} = [a_{n_j - n_i}]$ for $n_i, n_j \in C_{l+1}$. For $l = d+1$, one may use $$\Phi^T_{d+1} f = [f_i] \quad (87)$$

and $$\Phi^T_{d+1} \Phi_{d+1} = I_N, \quad (88)$$

where $I_N$ is the N×N identity matrix. This is possible, because the point locations $x_i$ can be taken to be the centers of the occupied voxels, or blocks $B_{d,n}$ at level d. This means that they are at the corners $C_{d+1}$ of blocks $B_{d+1}$ at level d+1, for which the tri-linear functions $\phi_{d+1,n}$, $n \in C_{d+1}$ do not overlap.

Consider now the orthogonal complement $G_l$ of $F_l$ in $F_{l+1}$. As in the case of constant B-splines, in the case of tri-linear B-splines, the basis functions $\Psi_{l,n}$ of $G_l$ depend locally on the point locations $\{x_i\}$ and hence are not shifts of each other as in the case of Lebesgue measure. In the case of constant B-splines, it is possible to explicitly define basis functions $\Psi_{l,n}$ orthogonal to each other and to $F_l$. Unfortunately, in the case of tri-linear B-splines, this is more challenging to do. One approach is to follow the procedure discussed above with respect to wavelets. There may be drawbacks of this approach, however. First, the basis functions $\Psi_{l,n}$ computed for the subspace $G_l$, though they are orthogonal to the basis functions $\phi_{l,n}$ for the subspace $F_l$, are not in general orthogonal to each other. Thus, quantizing them independently of each other may magnify the quantization error. Second, the procedure for finding the basis functions, which involves a large matrix inverse, would be followed at the decoder as well as the encoder, which may be undesirable for lightweight decoders.

In contrast, the approach implemented by the systems and methods discussed herein, which is an approximate approach, is to prune the octree back to a collection of blocks of varying sizes, such that the per-point approximation error within each block is below a threshold (e.g., a predetermined threshold value for per-point approximation error), and to keep the coefficients $F^*_{l,n}$ at the corners of these blocks. If two (or more) of such coefficients $F^*_{l,n}$ and $F^*_{l',n'}$ with $l' < l$ occupy the same position in space, i.e., $2^{-l'} n' = 2^{-l} n$, then the coefficients are combined in some way. In some example embodiments, the coefficients are averaged. In other example embodiments, the coefficients are optimized by a least square method. In further example embodiments, the coefficient at the lower level $l'$ is discarded. The kept coefficients $F^*_{l,n}$, each located at a different location $2^{-\ell}$ n, are themselves a point cloud, which can be compressed with RAHT using a constant B-spline.

Higher Order B-Splines

Volumetric B-splines of order p≥3 are possible, and offer higher order continuity properties. However, they are more complex to compute, and at each level $\ell$, they require significantly more coefficients per occupied block. Specifically, a function in $F_\ell$ requires $p^3$ coefficients per occupied block. Although some of these coefficients are shared between blocks, in some example embodiments, the extra smoothness gained from the higher order may not be worth the added bitrate or computational complexity.

Figure 6:
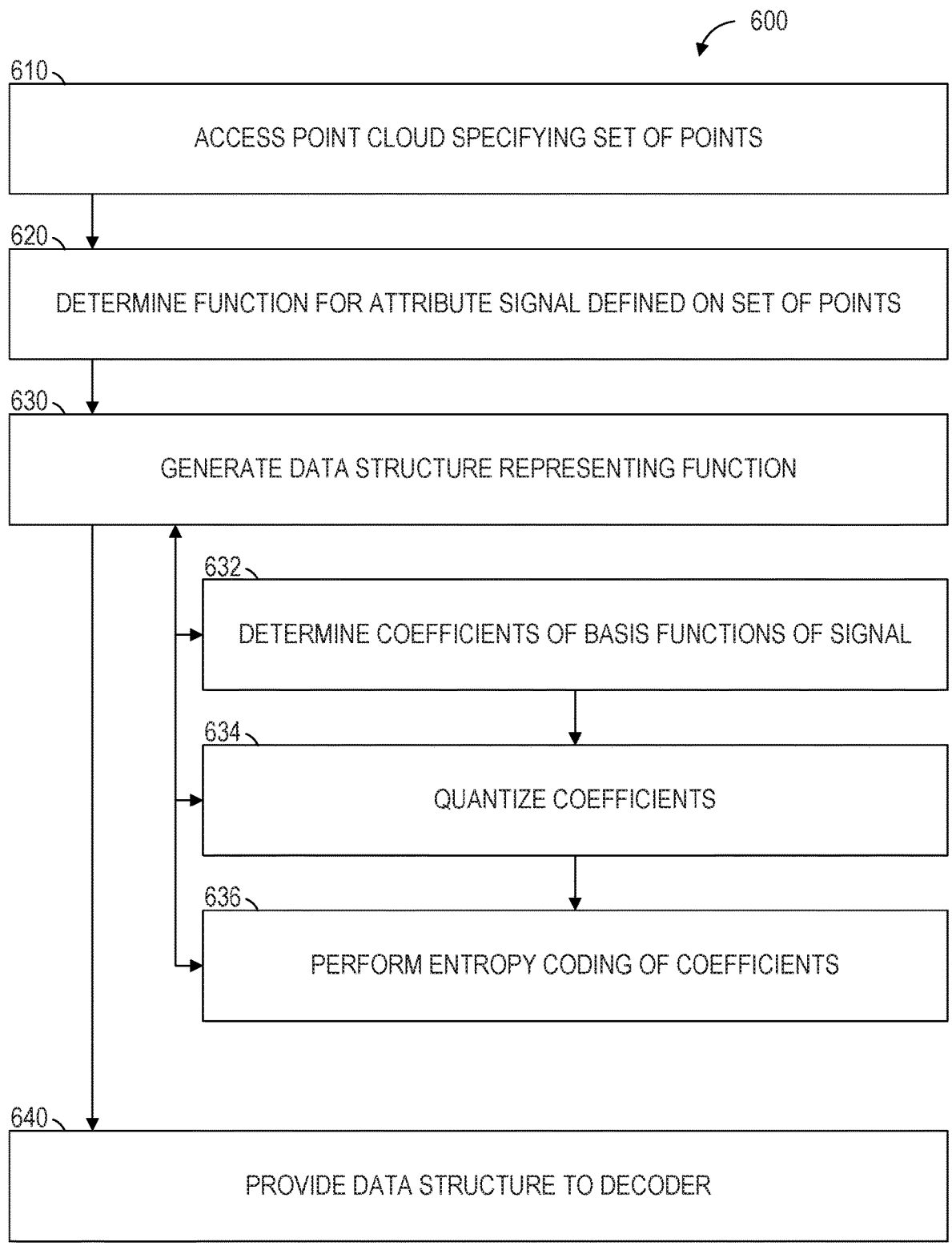
FIG. 6 is a flowchart illustrating operations in a method of encoding point cloud attributes, according to some example embodiments.

FIG. 6 is a flowchart illustrating operations in a method 600 of encoding attributes of a point cloud, according to some example embodiments. Some or all of the operations in the method 600 may be performed by an encoder machine (e.g., by one or more processors of an encoder device or other machine configured to compress data, such as data that specifies point cloud attributes). As shown, the method 600 includes one or more of operations 610, 620, 630, and 640.

In operation 610, the encoder machine accesses (e.g., reads, receives, or retrieves) a point cloud that specifies a finite set of points in three-dimensional space. The point cloud may be accessed by accessing data that describes, defines, or otherwise specifies the geometric information of the point cloud, the attribute information of the point cloud, or both.

In operation 620, the encoder machine determines (e.g., fits) a volumetric function (e.g., a volumetric B-spline function) based on values of a signal defined on the finite set of points of the point cloud accessed in operation 610.

In operation 630, the encoder machine generates a data structure that represents a volumetric function. The volumetric function represents the signal defined on the finite set of points of the point cloud accessed in operation 610.

In operation 640, the encoder machine provides (e.g., communicates or causes communication of) the data structure generated in operation 630 to a decoder machine. The decoder machine may be configured to recover values of the signal within a predetermined approximation threshold by evaluating the volumetric function on the finite set of points.

As shown in FIG. 6, operation 630 may include one or more of operations 632, 634, and 636. According to some example embodiments, in operation 632, as part of generating the data structure that represents the volumetric function, the encoder machine determines coefficients of basis functions that correspond to the signal defined on the finite set of points.

In some other example embodiments, however, the volumetric function that represents the signal is a first volumetric function that represents geometry information of the point cloud, and the point cloud further specifies a corresponding set of attributes (e.g., color) for each point among the finite set of points. Accordingly, the encoder machine may perform data compression on the sets of attributes that correspond to the finite set of points by determining a second volumetric function based on the sets of attributes. Thus, in operation 632, as part of generating the data structure that represents the second volumetric function, the encoder machine may determine coefficients of the second volumetric function.

In operation 634, the encoder machine quantizes the determined coefficients of the volumetric function (e.g., the first volumetric function, the second volumetric function, or both).

In operation 636, the encoder machine performs entropy coding on the determined coefficients (e.g., the quantized determined coefficients) discussed above with respect to operation 632, operation 634, or both.

Accordingly, in various example embodiments, performance of operation 640 includes providing entropy coded and quantized coefficients of the second volumetric function within the generated data structure to the decoder machine. This may be done by providing the generated data structure within a bit stream to the decoder machine.

Figure 7:
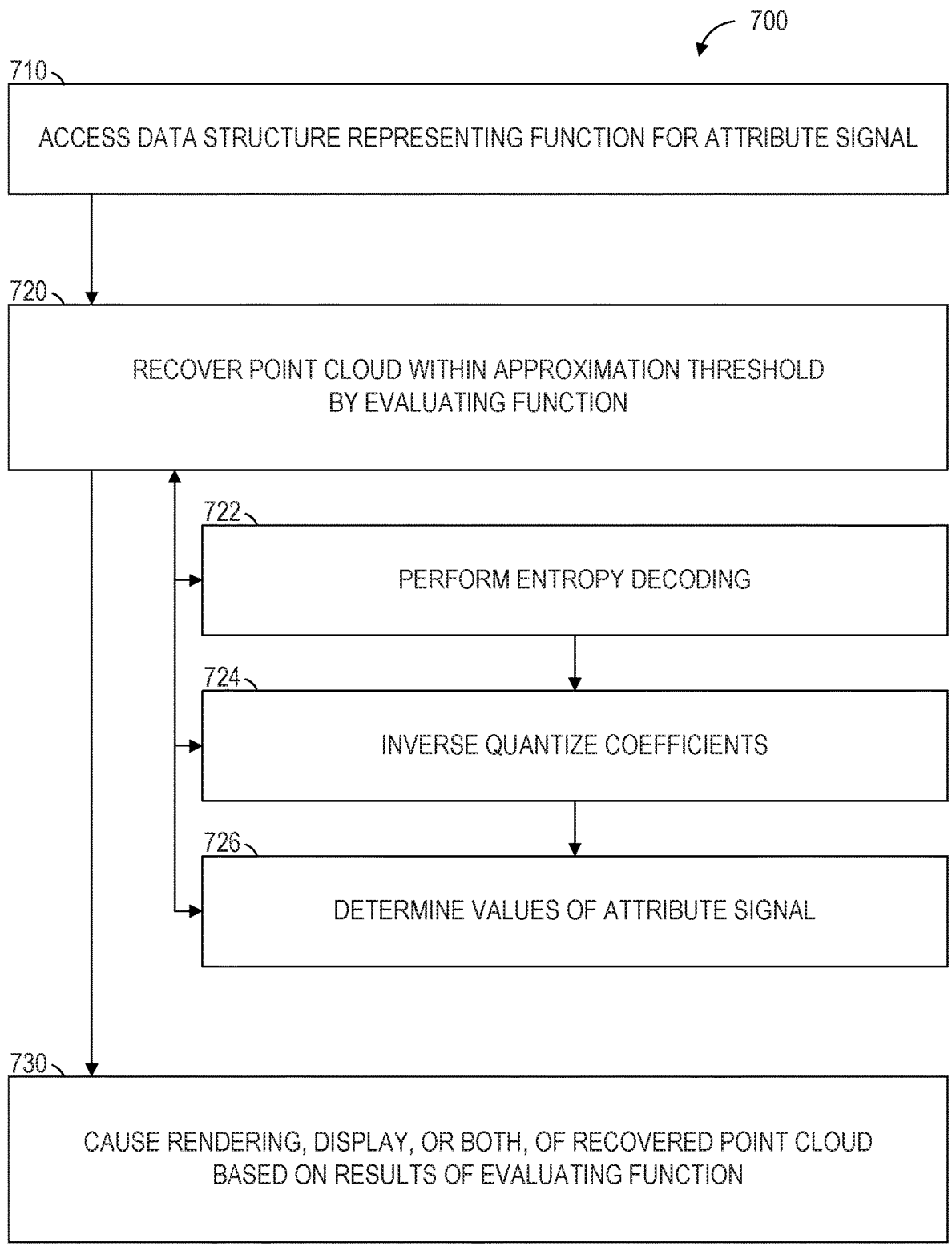
FIG. 7 is a flowchart illustrating operations in a method of decoding previously encoded point cloud attributes, according to some example embodiments.

FIG. 7 is a flowchart illustrating operations in a method 700 of decoding previously encoded attributes of a point cloud, according to some example embodiments. Some or all of the operations in the method 700 may be performed by a decoder machine (e.g., by one or more processors of a decoder device or other machine configured to decompress data, such as previously compressed data that specifies point cloud attributes). As shown, the method 700 includes one or more of operations 710, 720, and 730.

In operation 710, the decoder machine accesses (e.g., reads, receives, or retrieves) a data structure that represents a volumetric function (e.g., a volumetric B-spline function). The volumetric function represents a signal on a finite set of points specified by a point cloud in three-dimensional space. In some example embodiments, the accessing of the data structure includes receiving the data structure within a bit stream generated by an encoder machine. In addition, according to certain example embodiments, the accessed data structure includes coefficients of basis functions that correspond to the signal defined on the finite set of points specified by the point cloud.

In operation 720, the decoder machine recovers the point cloud, within a predetermined approximation threshold, by evaluating the volumetric function represented by the data structure accessed in operation 710. The result obtains data that describes, defines, or otherwise specifies (e.g., within the approximation threshold) the geometric information of the point cloud, the attribute information of the point cloud, or both.

In some example embodiments, the volumetric function that represents the signal is a first volumetric function that represents geometry information of the point cloud, and the point cloud further specifies a corresponding set of attributes (e.g., color) for each point among the finite set of points. Accordingly, the decoder machine may recover (e.g., within the approximation threshold) the sets of attributes by evaluating a second volumetric function defined by the accessed data structure, where the second volumetric function represents the sets of attributes that correspond to the finite set of points. Thus, as part of operation 720, prior to the evaluating of the second volumetric function, the decoder machine may determine (e.g., fit) the second volumetric function by performing one or more of operations 722, 724, and 726, any one or more of which may be included in operation 720.

In operation 722, the decoder machine performs entropy decoding on entropy coded and quantized coefficients of the second volumetric function.

In operation 724, the decoder machine determines coefficients of the second volumetric function by inverse quantizing the entropy decoded but still quantized coefficients of the second volumetric function.

In operation 726, the decoder machine determines values of the signal that is defined on the finite set of points specified by the point cloud.

In operation 730, the decoder machine causes (e.g., triggers, controls, or otherwise initiates) a rendering of the recovered point cloud, a display of the recovered point cloud, or both, based on results of operation 720 (e.g., based on the results of evaluating the volumetric function represented by the data structure accessed in operation 710).

According to various example embodiments, one or more of the methodologies described herein may facilitate representation of attributes of a point cloud. Moreover, one or more of the methodologies described herein may facilitate generating, storing, accessing, transmitting, receiving, compressing, decompressing, modifying, rendering, displaying, or any suitable combination thereof, a data structure that represents attributes of a point cloud. Hence, one or more of the systems and methods described herein may facilitate generating, storing, accessing, transmitting, receiving, compressing, decompressing, modifying, rendering, displaying, or any suitable combination thereof, computer graphics that include one or more point clouds, compared to capabilities of pre-existing systems and methods.

When these effects are considered in aggregate, one or more of the methodologies described herein may obviate a need for certain efforts or resources that otherwise would be involved in data operations on one or more representations of attributes of point clouds. Efforts expended by a user in using point clouds for computer graphics may be reduced by use of (e.g., reliance upon) a special-purpose machine that implements one or more of the methodologies described herein. Computing resources used by one or more systems or machines may similarly be reduced (e.g., compared to systems or machines that lack the structures discussed herein or are otherwise unable to perform the functions discussed herein). Examples of such computing resources include processor cycles, network traffic, computational capacity, main memory usage, graphics rendering capacity, graphics memory usage, data storage capacity, power consumption, and cooling capacity.

Figure 8:
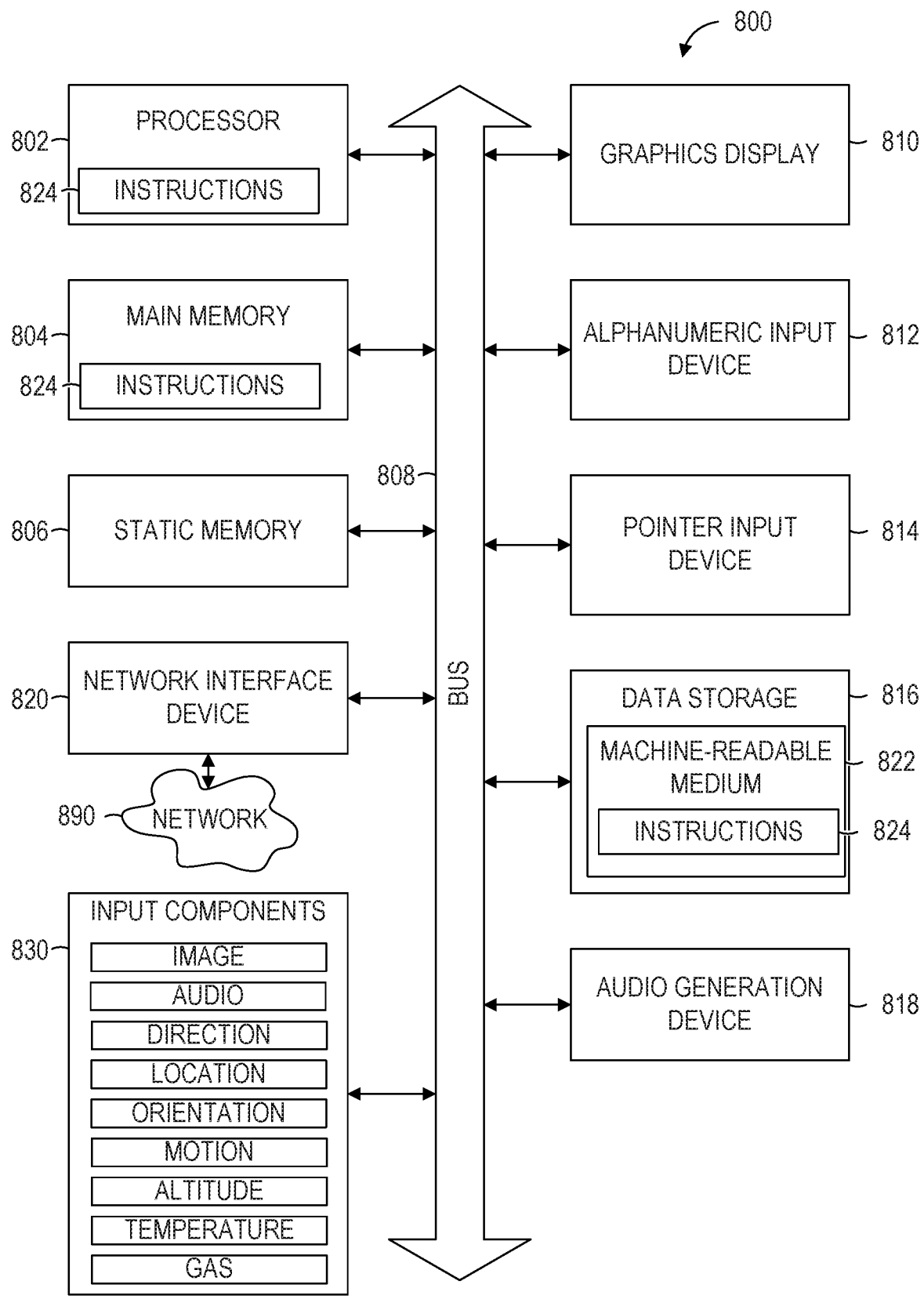
FIG. 8 is a block diagram illustrating components of a machine, according to some example embodiments, able to read instructions from a machine-readable medium and perform any one or more of the methodologies discussed herein.

FIG. 8 is a block diagram illustrating components of a machine 800, according to some example embodiments, able to read instructions 824 from a machine-readable medium 822 (e.g., a non-transitory machine-readable medium, a machine-readable storage medium, a computer-readable storage medium, or any suitable combination thereof) and perform any one or more of the methodologies discussed herein, in whole or in part. Specifically, FIG. 8 shows the machine 800 in the example form of a computer system (e.g., a computer) within which the instructions 824 (e.g., software, a program, an application, an applet, an app, or other executable code) for causing the machine 800 to perform any one or more of the methodologies discussed herein may be executed, in whole or in part.

In alternative embodiments, the machine 800 operates as a standalone device or may be communicatively coupled (e.g., networked) to other machines. In a networked deployment, the machine 800 may operate in the capacity of a server machine or a client machine in a server-client network environment, or as a peer machine in a distributed (e.g., peer-to-peer) network environment. The machine 800 may be a server computer, a client computer, a personal computer (PC), a tablet computer, a laptop computer, a netbook, a cellular telephone, a smart phone, a set-top box (STB), a personal digital assistant (PDA), a web appliance, a network router, a network switch, a network bridge, or any machine capable of executing the instructions 824, sequentially or otherwise, that specify actions to be taken by that machine. Further, while only a single machine is illustrated, the term "machine" shall also be taken to include any collection of machines that individually or jointly execute the instructions 824 to perform all or part of any one or more of the methodologies discussed herein.

The machine 800 includes a processor 802 (e.g., one or more central processing units (CPUs), one or more graphics processing units (GPUs), one or more digital signal processors (DSPs), one or more application specific integrated circuits (ASICs), one or more radio-frequency integrated circuits (RFICs), or any suitable combination thereof), a main memory 804, and a static memory 806, which are configured to communicate with each other via a bus 808. The processor 802 contains solid-state digital microcircuits (e.g., electronic, optical, or both) that are configurable, temporarily or permanently, by some or all of the instructions 824 such that the processor 802 is configurable to perform any one or more of the methodologies described herein, in whole or in part. For example, a set of one or more microcircuits of the processor 802 may be configurable to execute one or more modules (e.g., software modules) described herein. In some example embodiments, the processor 802 is a multicore CPU (e.g., a dual-core CPU, a quad-core CPU, an 8-core CPU, or a 128-core CPU) within which each of multiple cores behaves as a separate processor that is able to perform any one or more of the methodologies discussed herein, in whole or in part. Although the beneficial effects described herein may be provided by the machine 800 with at least the processor 802, these same beneficial effects may be provided by a different kind of machine that contains no processors (e.g., a purely mechanical system, a purely hydraulic system, or a hybrid mechanical-hydraulic system), if such a processor-less machine is configured to perform one or more of the methodologies described herein.

The machine 800 may further include a graphics display 810 (e.g., a plasma display panel (PDP), a light emitting diode (LED) display, a liquid crystal display (LCD), a projector, a cathode ray tube (CRT), or any other display capable of displaying graphics or video). The machine 800 may also include an alphanumeric input device 812 (e.g., a keyboard or keypad), a pointer input device 814 (e.g., a mouse, a touchpad, a touchscreen, a trackball, a joystick, a stylus, a motion sensor, an eye tracking device, a data glove, or other pointing instrument), a data storage 816, an audio generation device 818 (e.g., a sound card, an amplifier, a speaker, a headphone jack, or any suitable combination thereof), and a network interface device 820.

The data storage 816 (e.g., a data storage device) includes the machine-readable medium 822 (e.g., a tangible and non-transitory machine-readable storage medium) on which are stored the instructions 824 embodying any one or more of the methodologies or functions described herein. The instructions 824 may also reside, completely or at least partially, within the main memory 804, within the static memory 806, within the processor 802 (e.g., within the processor's cache memory), or any suitable combination thereof, before or during execution thereof by the machine 800. Accordingly, the main memory 804, the static memory 806, and the processor 802 may be considered machine-readable media (e.g., tangible and non-transitory machine-readable media). The instructions 824 may be transmitted or received over a network 890 via the network interface device 820. For example, the network interface device 820 may communicate the instructions 824 using any one or more transfer protocols (e.g., hypertext transfer protocol (HTTP)).

In some example embodiments, the machine 800 may be a portable computing device (e.g., a smart phone, a tablet computer, or a wearable device), and may have one or more additional input components 830 (e.g., sensors or gauges). Examples of such input components 830 include an image input component (e.g., one or more cameras), an audio input component (e.g., one or more microphones), a direction input component (e.g., a compass), a location input component (e.g., a global positioning system (GPS) receiver), an orientation component (e.g., a gyroscope), a motion detection component (e.g., one or more accelerometers), an altitude detection component (e.g., an altimeter), a temperature input component (e.g., a thermometer), and a gas detection component (e.g., a gas sensor). Input data gathered by any one or more of these input components may be accessible and available for use by any of the modules described herein (e.g., with suitable privacy notifications and protections, such as opt-in consent or opt-out consent, implemented in accordance with user preference, applicable regulations, or any suitable combination thereof).

As used herein, the term "memory" refers to a machine-readable medium able to store data temporarily or permanently and may be taken to include, but not be limited to, random-access memory (RAM), read-only memory (ROM), buffer memory, flash memory, and cache memory. While the machine-readable medium 822 is shown in an example embodiment to be a single medium, the term "machine-readable medium" should be taken to include a single medium or multiple media (e.g., a centralized or distributed database, or associated caches and servers) able to store instructions. The term "machine-readable medium" shall also be taken to include any medium, or combination of multiple media, that is capable of carrying (e.g., storing or communicating) the instructions 824 for execution by the machine 800, such that the instructions 824, when executed by one or more processors of the machine 800 (e.g., processor 802), cause the machine 800 to perform any one or more of the methodologies described herein, in whole or in part. Accordingly, a "machine-readable medium" refers to a single storage apparatus or device, as well as cloud-based storage systems or storage networks that include multiple storage apparatus or devices. The term "machine-readable medium" shall accordingly be taken to include, but not be limited to, one or more tangible and non-transitory data repositories (e.g., data volumes) in the example form of a solid-state memory chip, an optical disc, a magnetic disc, or any suitable combination thereof.

A "non-transitory" machine-readable medium, as used herein, specifically excludes propagating signals per se. According to various example embodiments, the instructions 824 for execution by the machine 800 can be communicated via a carrier medium (e.g., a machine-readable carrier medium). Examples of such a carrier medium include a non-transient carrier medium (e.g., a non-transitory machine-readable storage medium, such as a solid-state memory that is physically movable from one place to another place) and a transient carrier medium (e.g., a carrier wave or other propagating signal that communicates the instructions 824).

Certain example embodiments are described herein as including modules. Modules may constitute software modules (e.g., code stored or otherwise embodied in a machine-readable medium or in a transmission medium), hardware modules, or any suitable combination thereof. A "hardware module" is a tangible (e.g., non-transitory) physical component (e.g., a set of one or more processors) capable of performing certain operations and may be configured or arranged in a certain physical manner. In various example embodiments, one or more computer systems or one or more hardware modules thereof may be configured by software (e.g., an application or portion thereof) as a hardware module that operates to perform operations described herein for that module.

In some example embodiments, a hardware module may be implemented mechanically, electronically, hydraulically, or any suitable combination thereof. For example, a hardware module may include dedicated circuitry or logic that is permanently configured to perform certain operations. A hardware module may be or include a special-purpose processor, such as a field programmable gate array (FPGA) or an ASIC. A hardware module may also include programmable logic or circuitry that is temporarily configured by software to perform certain operations. As an example, a hardware module may include software encompassed within a CPU or other programmable processor. It will be appreciated that the decision to implement a hardware module mechanically, hydraulically, in dedicated and permanently configured circuitry, or in temporarily configured circuitry (e.g., configured by software) may be driven by cost and time considerations.

Accordingly, the phrase "hardware module" should be understood to encompass a tangible entity that may be physically constructed, permanently configured (e.g., hardwired), or temporarily configured (e.g., programmed) to operate in a certain manner or to perform certain operations described herein. Furthermore, as used herein, the phrase "hardware-implemented module" refers to a hardware module. Considering example embodiments in which hardware modules are temporarily configured (e.g., programmed), each of the hardware modules need not be configured or instantiated at any one instance in time. For example, where a hardware module includes a CPU configured by software to become a special-purpose processor, the CPU may be configured as respectively different special-purpose processors (e.g., each included in a different hardware module) at different times. Software (e.g., a software module) may accordingly configure one or more processors, for example, to become or otherwise constitute a particular hardware module at one instance of time and to become or otherwise constitute a different hardware module at a different instance of time.

Hardware modules can provide information to, and receive information from, other hardware modules. Accordingly, the described hardware modules may be regarded as being communicatively coupled. Where multiple hardware modules exist contemporaneously, communications may be achieved through signal transmission (e.g., over circuits and buses) between or among two or more of the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory (e.g., a memory device) to which it is communicatively coupled. A further hardware module may then, at a later time, access the memory to retrieve and process the stored output. Hardware modules may also initiate communications with input or output devices, and can operate on a resource (e.g., a collection of information from a computing resource).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions described herein. As used herein, "processor-implemented module" refers to a hardware module in which the hardware includes one or more processors. Accordingly, the operations described herein may be at least partially processor-implemented, hardware-implemented, or both, since a processor is an example of hardware, and at least some operations within any one or more of the methods discussed herein may be performed by one or more processor-implemented modules, hardware-implemented modules, or any suitable combination thereof.

Moreover, such one or more processors may perform operations in a "cloud computing" environment or as a service (e.g., within a "software as a service" (SaaS) implementation). For example, at least some operations within any one or more of the methods discussed herein may be performed by a group of computers (e.g., as examples of machines that include processors), with these operations being accessible via a network (e.g., the Internet) and via one or more appropriate interfaces (e.g., an application program interface (API)). The performance of certain operations may be distributed among the one or more processors, whether residing only within a single machine or deployed across a number of machines. In some example embodiments, the one or more processors or hardware modules (e.g., processor-implemented modules) may be located in a single geographic location (e.g., within a home environment, an office environment, or a server farm). In other example embodiments, the one or more processors or hardware modules may be distributed across a number of geographic locations.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and their functionality presented as separate components and functions in example configurations may be implemented as a combined structure or component with combined functions. Similarly, structures and functionality presented as a single component may be implemented as separate components and functions. These and other variations, modifications, additions, and improvements fall within the scope of the subject matter herein.

Some portions of the subject matter discussed herein may be presented in terms of algorithms or symbolic representations of operations on data stored as bits or binary digital signals within a memory (e.g., a computer memory or other machine memory). Such algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "accessing," "processing," "detecting," "computing," "calculating," "determining," "generating," "presenting," "displaying," or the like refer to actions or processes performable by a machine (e.g., a computer) that manipulates or transforms data represented as physical (e.g., electronic, magnetic, or optical) quantities within one or more memories (e.g., volatile memory, non-volatile memory, or any suitable combination thereof), registers, or other machine components that receive, store, transmit, or display information. Furthermore, unless specifically stated otherwise, the terms "a" or "an" are herein used, as is common in patent documents, to include one or more than one instance. Finally, as used herein, the conjunction "or" refers to a non-exclusive "or," unless specifically stated otherwise.

The following enumerated embodiments describe various example embodiments of methods, machine-readable media, and systems (e.g., machines, devices, or other apparatus) discussed herein.

A first embodiment provides a method comprising:
accessing, by one or more processors of an encoder machine, a point cloud that specifies a finite set of points in three-dimensional space; and
generating, by one or more processors of the encoder machine, a data structure that represents a volumetric function, the volumetric function representing a signal defined on the finite set of points of the accessed point cloud.

A second embodiment provides a method according to the first embodiment, further comprising:
determining the volumetric function based on values of the signal defined on the finite set of points of the accessed point cloud.

A third embodiment provides a method according to the first embodiment or the second embodiment, further comprising:
providing the generated data structure to a decoder machine configured to recover values of the signal within a predetermined approximation threshold by evaluating the volumetric function on the finite set of points.

A fourth embodiment provides a method according to any of the first through third embodiments, wherein:
the generating the data structure that represents the volumetric function includes determining coefficients of basis functions that correspond to the signal defined on the finite set of points.

A fifth embodiment provides a method according to any of the first, second, or fourth embodiments, wherein:
the volumetric function that represents the signal is a first volumetric function that represents geometry information of the point cloud;
the point cloud specifies a corresponding set of attributes for each point among the finite set of points; and
the method further comprises:
performing data compression on the sets of attributes that correspond to the finite set of points by determining a second volumetric function based on the sets of attributes.

A sixth embodiment provides a method according to the fifth embodiment, wherein:
the generating of the data structure includes:
determining coefficients of the second volumetric function;
quantizing the determined coefficients of the second volumetric function; and
performing entropy coding on the quantized coefficients of the second volumetric function.

A seventh embodiment provides a method according to the sixth embodiment, further comprising:
providing the entropy coded and quantized coefficients of the second volumetric function within the generated data structure to a decoder machine by providing the generated data structure within a bit stream to the decoder machine.

An eighth embodiment provides a method comprising:
accessing, by one or more processors of a decoder machine, a data structure that represents a volumetric function, the volumetric function representing a signal defined on a finite set of points specified by a point cloud in three-dimensional space;
recovering, by one or more processors of the decoder machine, the point cloud within a predetermined approximation threshold by evaluating the volumetric function represented by the accessed data structure; and
causing, by one or more processors of the decoder machine, rendering and display of the recovered point cloud based on results of the evaluating of the volumetric function represented by the accessed data structure.

A ninth embodiment provides a method according to the eighth embodiment, wherein:
in the recovering of the point cloud, the evaluating of the volumetric function determines values of the signal defined on the finite set of points specified by the point cloud.

A tenth embodiment provides a method according to the eighth embodiment or the ninth embodiment, wherein:
the accessing of the data structure includes receiving the data structure within a bit stream generated by an encoder machine.

An eleventh embodiment provides a method according to any of the eighth through tenth embodiments, wherein:
the accessed data structure includes coefficients of basis functions that correspond to the signal defined on the finite set of points specified by the point cloud.

A twelfth embodiment provides a method according to any of the eight through eleventh embodiments, wherein:
the volumetric function that represents the signal is a first volumetric function that represents geometry information of the point cloud;
the point cloud specifies a corresponding set of attributes for each point among the finite set of points; and
the method further comprises:
evaluating a second volumetric function defined by the accessed data structure, the second volumetric function representing the sets of attributes that correspond to the finite set of points.

A thirteenth embodiment provides a method according to the twelfth embodiment, further comprising:
prior to the evaluating of the second volumetric function, determining the second volumetric function by:
performing entropy decoding on entropy coded and quantized coefficients of the second volumetric function; and
determining the coefficients of the second volumetric function by inverse quantizing the entropy decoded but still quantized coefficients of the second volumetric function.

A fourteenth embodiment provides an encoder system comprising: one or more processors; and
a memory storing instructions that, when executed by at least one processor among the one or more processors, cause the system to perform operations comprising: accessing a point cloud that specifies a finite set of points in three-dimensional space; and
generating a data structure that represents a volumetric function, the volumetric function representing a signal defined on the finite set of points of the accessed point cloud.

A fifteenth embodiment provides a decoder system comprising: one or more processors; and
a memory storing instructions that, when executed by at least one processor among the one or more processors, cause the system to perform operations comprising:
accessing a data structure that represents a volumetric function, the volumetric function representing a signal defined on a finite set of points specified by a point cloud in three-dimensional space;
recovering the point cloud within a predetermined approximation threshold by evaluating the volumetric function represented by the accessed data structure; and
causing rendering and display of the recovered point cloud based on results of the evaluating of the volumetric function represented by the accessed data structure.

A sixteenth embodiment provides a machine-readable medium (e.g., a non-transitory machine-readable storage medium) comprising instructions that, when executed by one or more processors of an encoder machine, cause the encoder machine to perform operations comprising:
accessing a point cloud that specifies a finite set of points in three-dimensional space; and
generating a data structure that represents a volumetric function, the volumetric function representing a signal defined on the finite set of points of the accessed point cloud.

A seventeenth embodiment provides a machine-readable medium (e.g., a non-transitory machine-readable storage medium) comprising instructions that, when executed by one or more processors of a decoder machine, cause the decoder machine to perform operations comprising:
accessing a data structure that represents a volumetric function, the volumetric function representing a signal defined on a finite set of points specified by a point cloud in three-dimensional space;
recovering the point cloud within a predetermined approximation threshold by evaluating the volumetric function represented by the accessed data structure; and causing rendering and display of the recovered point cloud based on results of the evaluating of the volumetric function represented by the accessed data structure.

An eighteenth embodiment provides a method comprising operations substantially as herein described and illustrated.

A nineteenth embodiment provides a machine-readable medium (e.g., a non-transitory machine-readable storage medium) comprising instructions that, when executed by one or more processors of a machine, cause the machine to perform operations substantially as herein described and illustrated.

A twentieth embodiment provides a system comprising: one or more processors; and
a memory storing instructions that, when executed by at least one processor among the one or more processors, cause the system to perform operations substantially as herein described and illustrated.

A twenty-first embodiment provides a carrier medium carrying machine-readable instructions for controlling a machine to carry out the method of any one of the first through thirteenth embodiments.

What is claimed is:

1. A method comprising:
    accessing, by one or more processors of an encoder machine, a point cloud that specifies a finite set of points in three-dimensional space; and
    generating, by one or more processors of the encoder machine, a data structure that represents a volumetric function, the volumetric function representing a signal defined on the finite set of points of the accessed point cloud.

2. The method of claim 1, further comprising:
    determining the volumetric function based on values of the signal defined on the finite set of points of the accessed point cloud.

3. The method of claim 1, further comprising:
providing the generated data structure to a decoder machine configured to recover values of the signal within a predetermined approximation threshold by evaluating the volumetric function on the finite set of points.

4. The method of claim 1, wherein:
the generating the data structure that represents the volumetric function includes determining coefficients of basis functions that correspond to the signal defined on the finite set of points.

5. The method of claim 1, wherein:
the volumetric function that represents the signal is a first volumetric function that represents geometry information of the point cloud;
the point cloud specifies a corresponding set of attributes for each point among the finite set of points; and
the method further comprises:
performing data compression on the sets of attributes that correspond to the finite set of points by determining a second volumetric function based on the sets of attributes.

6. The method of claim 5, wherein:
the generating of the data structure includes:
determining coefficients of the second volumetric function;
quantizing the determined coefficients of the second volumetric function; and
performing entropy coding on the quantized coefficients of the second volumetric function.

7. The method of claim 6, further comprising:
providing the entropy coded and quantized coefficients of the second volumetric function within the generated data structure to a decoder machine by providing the generated data structure within a bit stream to the decoder machine.

8. A method comprising:
accessing, by one or more processors of a decoder machine, a data structure that represents a volumetric function, the volumetric function representing a signal on a finite set of points specified by a point cloud in three-dimensional space;
recovering, by one or more processors of the decoder machine, the point cloud within a predetermined approximation threshold by evaluating the volumetric function represented by the accessed data structure; and
causing, by one or more processors of the decoder machine, rendering and display of the recovered point cloud based on results of the evaluating of the volumetric function represented by the accessed data structure.

9. The method of claim 8, wherein:
in the recovering of the point cloud, the evaluating of the volumetric function determines values of the signal defined on the finite set of points specified by the point cloud.

10. The method of claim 8, wherein:
the accessing of the data structure includes receiving the data structure within a bit stream generated by an encoder machine.

11. The method of claim 8, wherein:
the accessed data structure includes coefficients of basis functions that correspond to the signal defined on the finite set of points specified by the point cloud.

12. The method of claim 8, wherein:
the volumetric function that represents the signal is a first volumetric function that represents geometry information of the point cloud;
the point cloud specifies a corresponding set of attributes for each point among the finite set of points; and
the method further comprises:
evaluating a second volumetric function defined by the accessed data structure, the second volumetric function representing the sets of attributes that correspond to the finite set of points.

13. The method of claim 12, further comprising:
prior to the evaluating of the second volumetric function, determining the second volumetric function by:
performing entropy decoding on entropy coded and quantized coefficients of the second volumetric function; and
determining the coefficients of the second volumetric function by inverse quantizing the entropy decoded but still quantized coefficients of the second volumetric function.

14. An encoder system comprising:
one or more processors; and
a memory storing instructions that, when executed by at least one processor among the one or more processors, cause the system to perform operations comprising:
accessing a point cloud that specifies a finite set of points in three-dimensional space; and
generating a data structure that represents a volumetric function, the volumetric function representing a signal defined on the finite set of points of the accessed point cloud.

15. The encoder system of claim 14, wherein the operations further comprise:
providing the generated data structure to a decoder machine configured to recover values of the signal within a predetermined approximation threshold by evaluating the volumetric function on the finite set of points.

16. A decoder system comprising:
one or more processors; and
a memory storing instructions that, when executed by at least one processor among the one or more processors, cause the system to perform operations comprising:
accessing a data structure that represents a volumetric function, the volumetric function representing a signal on a finite set of points specified by a point cloud in three-dimensional space;
recovering the point cloud within a predetermined approximation threshold by evaluating the volumetric function represented by the accessed data structure; and
causing rendering and display of the recovered point cloud based on results of the evaluating of the volumetric function represented by the accessed data structure.

17. A non-transitory machine-readable storage medium comprising instructions that, when executed by one or more processors of an encoder machine, cause the encoder machine to perform operations comprising:
accessing a point cloud that specifies a finite set of points in three-dimensional space; and
generating a data structure that represents a volumetric function, the volumetric function representing a signal defined on the finite set of points of the accessed point cloud.

18. The non-transitory machine-readable storage medium of claim 17, wherein the operations further comprise:

providing the generated data structure to a decoder machine configured to recover values of the signal within a predetermined approximation threshold by evaluating the volumetric function on the finite set of points.

19. A non-transitory machine-readable storage medium comprising instructions that, when executed by one or more processors of a decoder machine, cause the decoder machine to perform operations comprising:
   accessing a data structure that represents a volumetric function, the volumetric function representing a signal on a finite set of points specified by a point cloud in three-dimensional space;
   recovering the point cloud within a predetermined approximation threshold by evaluating the volumetric function represented by the accessed data structure; and
   causing rendering and display of the recovered point cloud based on results of the evaluating of the volumetric function represented by the accessed data structure.

20. The non-transitory machine-readable storage medium of claim 19, wherein:
   in the recovering of the point cloud, the evaluating of the volumetric function determines values of the signal defined on the finite set of points specified by the point cloud.

* * * * *

UNITED STATES PATENT AND TRADEMARK OFFICE
CERTIFICATE OF CORRECTION

PATENT NO. : 10,853,447 B2
APPLICATION NO. : 16/250704
DATED : December 1, 2020
INVENTOR(S) : Chou et al.

It is certified that error appears in the above-identified patent and that said Letters Patent is hereby corrected as shown below:

On the Title Page

On page 2, in Column 1, under "Other Publications", Line 4, delete "Represenation" and insert --Representation-- therefor On page 2, in Column 2, under "Other Publications", Line 8, delete "probablilities"," and insert --probabilities",-- therefor On page 2, in Column 2, under "Other Publications", Line 10, delete ""Optimation" and insert --"Optimization-- therefor In the Specification In Column 2, Line 13, delete "(RANT)," and insert --(RAHT),-- therefor In Column 4, Line 8, delete "ν(M)=|M∩B|" and insert --$\mu(M) = |M \cap B|$-- therefor In Column 4, Line 32, delete "$\|f\| \triangleq \sqrt{>f,f>}$" and insert --$\|f\| \triangleq \sqrt{<f,f>}$-- therefor In Column 5, Line 14, delete "m th" and insert --$m^{th}$-- therefor In Column 5, Line 28, delete "tri polynomial" and insert --*tri-polynomial*-- therefor In Column 6, Line 18, after "n∈Z³,", insert --and--

In Column 6, Line 29, delete "$\phi_{0,0}(x)=\phi^{(p)}(x-n_1)$" and insert --$\phi_{0,0}(x) = \phi^{(p)}(x - n_0)$-- therefor Signed and Sealed this
Twenty-eighth Day of December, 2021

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 10,853,447 B2

In Column 6, Line 48, delete "$f_0^*(x) =_n(x).$" and insert --$f_0^*(\mathbf{x}) = \sum_{\mathbf{n} \in Z^3} F_\mathbf{n}^* \phi_{0,\mathbf{n}}(\mathbf{x}).$-- therefor In Column 7, Line 1, delete "n∈N₀," and insert --$\mathbf{n} \notin N_0$,-- therefor In Column 7, Lines 26-27, equation (18), delete "$\phi^\ell{}_{,n}(x) = \phi_{0,n}(2^\ell x)$" and insert --$\phi_{\ell,\mathbf{n}}(\mathbf{x}) = \phi_{0,\mathbf{n}}(2^\ell \mathbf{x})$-- therefor In Column 7, Lines 37-38, delete "$\ell, \{2^{-\ell}([0,1]+^3+n)|n \in Z^3\}.$" and insert --$\ell, \{2^{-\ell}([0,1]^3 + \mathbf{n}) | \mathbf{n} \in Z^3\}.$-- therefor In Column 7, Lines 43-44, equation (20), delete "$F_0 \subseteq F_1 \subseteq \ldots \subseteq F_\ell \subseteq F_{\ell+1} \subseteq \ldots \subseteq F$" and insert --$F_0 \subseteq F_1 \subseteq \ldots \subseteq F_\ell \subseteq F_{\ell+1} \subseteq \ldots \subseteq F$-- therefor In Column 7, Line 47, delete "$f_{\ell+1}^* = f \circ F_{\ell+1}$" and insert --$f_{\ell+1}^* = f \circ F_{\ell+1}$-- therefor In Column 7, Line 54, delete "$f_\ell^* = f_{\ell-1}^* \circ F_\ell.$" and insert --$f_\ell^* = f_{\ell+1}^* \circ F_\ell.$-- therefor In Column 7, Line 56, delete "$F_{\ell+1}$ (i.e., $f_{\ell+1}^* = f \circ F_{\ell+1}$)" and insert --$F_{\ell+1}$ (i.e., $f_{\ell+1}^* = f \circ F_{\ell+1}$)-- therefor In Column 8, Line 11, delete "| N$_\ell$ |×|z,114 |" and insert --| N$_\ell$ | × | N$_\ell$ |-- therefor In Column 8, Line 16, delete "$\Phi_{\ell+1}^T$ and $\Phi_{\ell+1}^T \Phi_{\ell+1}$," and insert --$\Phi_{\ell+1}^T f$ and $\Phi_{\ell+1}^T \Phi_{\ell+1}$,-- therefor In Column 8, Line 17, delete "$\phi_{\ell,n}^{(p)} \in F_\ell \subseteq F_{\ell+1}$," and insert --$\phi_{\ell,\mathbf{n}}^{(p)} \in F_\ell \subseteq F_{\ell+1}$,-- therefor In Column 8, Lines 37-38, equation (30), delete "$\Phi_\ell^T f = A_{\ell+1} \Phi_\ell^T{}_{+1} f$" and insert --$\Phi_\ell^T f = A_{\ell+1} \Phi_{\ell+1}^T f$-- therefor

CERTIFICATE OF CORRECTION (continued)
U.S. Pat. No. 10,853,447 B2

In Column 8, Lines 41-42, equation (31), delete "$\Phi_\ell^T \Phi_\ell = A_{\ell-1} \Phi_{\ell+1}^T \Phi_{\ell+1} A_{\ell-1}^T$," and insert --$\Phi_\ell^T \Phi_\ell = A_{\ell+1} \Phi_{\ell+1}^T \Phi_{\ell+1} A_{\ell+1}^T$,-- therefor In Column 8, Line 43, delete "$A_{\ell-1} = [a_{n_j - n_i}]$." and insert --$A_{\ell+1} = [a_{n_j - n_i}]$.-- therefor In Column 8, Lines 46-47, equation (32), delete "$F_{\ell|1} = F_\ell \otimes G_\ell$." and insert --$F_{\ell+1} = F_\ell \oplus G_\ell$.-- therefor In Column 8, Lines 48-49, equation (33), delete "$F = F_0 \otimes G_0 \otimes G_1 \otimes \ldots \otimes G_\ell \otimes \ldots$," and insert --$F = F_0 \oplus G_0 \oplus G_1 \oplus \ldots \oplus G_\ell \oplus \ldots$,-- therefor In Column 8, Lines 52-53, equation (34), delete "$f_{\ell-1} = f_0 + g_0 + g_1 + \ldots + g_\ell + \ldots$," and insert --$f_{\ell+1} = f_0 + g_0 + g_1 + \cdots + g_\ell + \cdots$.-- therefor In Column 9, Line 1, delete "$F_{\ell|1}$." and insert --$F_{\ell+1}$.-- therefor In Column 9, Line 6, delete "$G_\ell \subseteq F_{\ell|1}$" and insert --$G_\ell \subseteq F_{\ell+1}$-- therefor In Column 9, Lines 7-8, equation (35), delete "$G_\ell = \{\Phi_{\ell+1} F_{\ell+1}' | \Phi_\ell^T \Phi_{\ell|1} F_{\ell+1}' = 0\}$," and insert --$G_\ell = \{\Phi_{\ell+1} F_{\ell+1}' | \Phi_\ell^T \Phi_{\ell+1} F_{\ell+1}' = 0\}$-- therefor In Column 9, Line 11, delete "$N_{\ell 1}$" and insert --$N_{\ell+1}$-- therefor In Column 9, Line 12, delete "$N_{\ell-1} - N_\ell$" and insert --$N_{\ell+1} - N_\ell$-- therefor In Column 9, Line 17, delete "$N_\ell \times N_{\ell 1}$" and insert --$N_\ell \times N_{\ell+1}$-- therefor In Column 9, Line 17, delete "$\Phi_\ell^T \Phi_{\ell-1}$" and insert --$\Phi_\ell^T \Phi_{\ell+1}$-- therefor In Column 9, Line 18, delete "$N_\ell \times (N_{\ell-1} - N_\ell)$" and insert --$N_\ell \times (N_{\ell+1} - N_\ell)$-- therefor In Column 9, Line 19, delete "$\Phi_\ell^T \Phi_{\ell-1} = [R' \ R'']$." and insert --$\Phi_\ell^T \Phi_{\ell+1} = [R' \ R'']$.-- therefor

CERTIFICATE OF CORRECTION (continued)
U.S. Pat. No. 10,853,447 B2

In Column 9, Line 19, delete "$N_{\ell-1}$" and insert --$N_{\ell+1}$-- therefor In Column 9, Line 20, delete "$F_{\ell|1}$" and insert --$F_{\ell+1}$-- therefor In Column 9, Line 20, delete "$N_{\ell-1} - N_\ell$" and insert --$N_{\ell+1} - N_\ell$-- therefor In Column 9, Line 29, delete "$\Phi_\ell^T \Phi_{\ell|1} F'_{\ell+1} = 0$," and insert --$\Phi_\ell^T \Phi_{\ell+1} F_{\ell+1} = 0$-- therefor In Column 9, Line 50, delete "$(N_{\ell-1} - N_\ell) \times (N_{\ell+1} - N_\ell)$," and insert --$(N_{\ell+1} - N_\ell) \times (N_{\ell+1} - N_\ell)$-- therefor In Column 9, Line 51, delete "$(N_{\ell 1} - N_\ell)$" and insert --$(N_{\ell+1} - N_\ell)$-- therefor In Column 9, Lines 59-60, delete "$f_{\ell-1} = \Phi_{\ell-1} F_{\ell-1} \in F_{\ell+1}$," and insert --$f_{\ell+1} = \Phi_{\ell+1} F_{\ell+1} \in F_{\ell+1}$-- therefor In Column 10, Line 7, delete "$\Phi_{\ell|1}$," and insert --$\Phi_{\ell+1}$,-- therefor In Column 12, Line 7, delete "$X \subset [0,1)^3$," and insert --$X \subset [0,1]^3$,-- therefor In Column 12, Line 34, delete "$[0,1)^3$." and insert --$[0,1]^3$.-- therefor In Column 12, Line 36, delete "$x \in [0,1)^3$" and insert --$x \in [0,1]^3$-- therefor In Column 12, Lines 38-40, equation (58), delete
"$B_{\ell,(n_x,n_y,n_z)} = [2^{-\ell} n_x, 2^{-\ell}(n_x+1)) \times [2^{-\ell} n_y, 2^{-\ell}(n_y+1)) \times [2^{-\ell} n_z, 2^{-\ell}(n_z+1))$," and insert
--$B_{\ell,(n_x,n_y,n_z)} = [2^{-\ell'} n_x, 2^{-\ell'}(n_x+1)) \times [2^{-\ell'} n_y, 2^{-\ell'}(n_y+1)) \times [2^{-\ell'} n_z, 2^{-\ell'}(n_z+1))$,-- therefor In Column 12, Line 42, delete "$2^\ell \times 2^\ell \times 2^\ell$" and insert --$2^{-\ell'} \times 2^{-\ell'} \times 2^{-\ell'}$-- therefor In Column 12, Line 43, delete "$n_z \in \{0, \ldots, 2^\ell 1\}$." and insert --$n_z \in \{0,\ldots,2^{\ell'} - 1\}$.-- therefor In Column 12, Line 46, delete "$2^{-\ell} \times 2^{-\ell} \times 2^{-(\ell+1)}$" and insert --$2^{-\ell'} \times 2^{-\ell'} \times 2^{-(\ell'+1)}$-- therefor

CERTIFICATE OF CORRECTION (continued)

In Column 12, Line 48, delete "$n_z \in \{0,\ldots,2^{\ell-1}-1\}$," and insert --$n_z \in \{0,\ldots,2^{\ell+1}-1\}$,-- therefor In Column 12, Line 49, delete "$2^{-\ell'} \times 2^{-(\ell'-1)} \times 2^{-(\ell'-1)}$" and insert --$2^{-\ell'} \times 2^{-(\ell'+1)} \times 2^{-(\ell'+1)}$-- therefor In Column 12, Line 50, delete "$n_x \in \{0,\ldots,2^{\ell'}-1\}$" and insert --$n_x \in \{0,\ldots,2^{\ell'}-1\}$-- therefor In Column 12, Line 51, delete "$n_y, n_z \in \{0,\ldots,2^{\ell'+1}-1\}$." and insert --$n_y, n_z \in \{0,\ldots,2^{\ell'+1}-1\}$.-- therefor In Column 13, Line 6, delete "f:[0,1)³→R" and insert --f:[0,1]³→R-- therefor In Column 13, Lines 52-53, delete "$w_0 = w_{\ell|1,2\mathbf{n}}$" and insert --$w_0 = w_{\ell+1,2\mathbf{n}}$-- therefor In Column 13, Line 53, delete "$w_1 = w_{\ell-1,2\mathbf{n}-1}$." and insert --$w_1 = w_{\ell+1,2\mathbf{n}+1}$.-- therefor In Column 14, Line 11, delete "$B_{\ell-1,2\mathbf{n}-1}$" and insert --$B_{\ell+1,2\mathbf{n}+1}$-- therefor In Column 15, Lines 56-57, delete "$B_{\ell,\mathbf{n}}, \mathbf{n}' \in \psi_{\ell,\mathbf{n}}$." and insert --$B_{\ell,\mathbf{n}'}, \mathbf{n}' \in N_\ell$.-- therefor In Column 16, Lines 15-16, equation (85), delete "$\Phi_\ell^T f = A_{\ell+1} \Phi_{\ell+1}^T f$" and insert --$\Phi_\ell^T f = A_{\ell+1} \Phi_{\ell+1}^T f$-- therefor In Column 16, Lines 18-19, equation (86), delete "$\Phi_\ell^T \Phi_\ell = A_{\ell+1} \Phi_{\ell-1}^T \Phi_{\ell-1} A_{\ell+1}^T$" and insert --$\Phi_\ell^T \Phi_\ell = A_{\ell+1} \Phi_{\ell+1}^T \Phi_{\ell+1} A_{\ell+1}^T$,-- therefor In Column 16, Line 35, delete "$F_{\ell|1}$." and insert --$F_{\ell+1}$.-- therefor